United States Patent
Komori

(10) Patent No.: US 7,396,764 B2
(45) Date of Patent: Jul. 8, 2008

(54) MANUFACTURING METHOD FOR FORMING ALL REGIONS OF THE GATE ELECTRODE SILICIDED

(75) Inventor: Shigeki Komori, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 210 days.

(21) Appl. No.: 11/381,654

(22) Filed: May 4, 2006

(65) Prior Publication Data

US 2007/0026600 A1    Feb. 1, 2007

(30) Foreign Application Priority Data

Jul. 6, 2005   (JP) .............................. 2005-197055

(51) Int. Cl.
   *H01L 21/44*   (2006.01)
(52) U.S. Cl. .................. 438/655; 438/581; 438/583; 438/630; 438/649; 438/651; 438/721; 438/658; 438/664; 438/682; 438/755; 257/E21.19; 257/E21.165; 257/E21.438
(58) Field of Classification Search ............... 438/581, 438/583, 630, 649, 651, 655, 658, 664, 682, 438/721, 755
   See application file for complete search history.

(56) References Cited

FOREIGN PATENT DOCUMENTS

| JP | 1-183851 | 7/1989 |
|---|---|---|
| JP | 7-245396 | 9/1995 |
| JP | 8-46057 | 2/1996 |
| JP | 11-121745 | 4/1999 |
| JP | 2000-252462 | 9/2000 |
| JP | 2002-319670 | 10/2002 |

OTHER PUBLICATIONS

U.S. Appl. No. 11/319,740, filed Dec. 29, 2005, Kuroi.
U.S. Appl. No. 11/381,654, filed May 4, 2006, Komori.
B. Tavel, et al., "Totally Silicided (CoSi2) Polysilicon: a novel approach to very low-resistive gate (~2 Ω/□) without metal CMP nor etching", International Electron Device Meeting, 2001, pp. 1-4.

*Primary Examiner*—Thanh V Pham
(74) *Attorney, Agent, or Firm*—Oblon, Spivak, McClelland, Maier & Neustadt, P.C.

(57) ABSTRACT

The technology which can improve the performance of a MOS transistor in which all the regions of the gate electrode were silicided is offered.

A gate insulating film and a gate electrode of an nMOS transistor are laminated and formed in this order on a semiconductor substrate. A source/drain region of the nMOS transistor is formed in the upper surface of the semiconductor substrate. The source/drain region is silicided after siliciding all the regions of the gate electrode. Thus, silicide does not cohere in the source/drain region by the heat treatment at the silicidation of the gate electrode by siliciding the source/drain region after the silicidation of the gate electrode. Therefore, the electric resistance of the source/drain region is reduced and junction leak can be reduced. As a result, the performance of the nMOS transistor improves.

9 Claims, 20 Drawing Sheets

F I G . 4
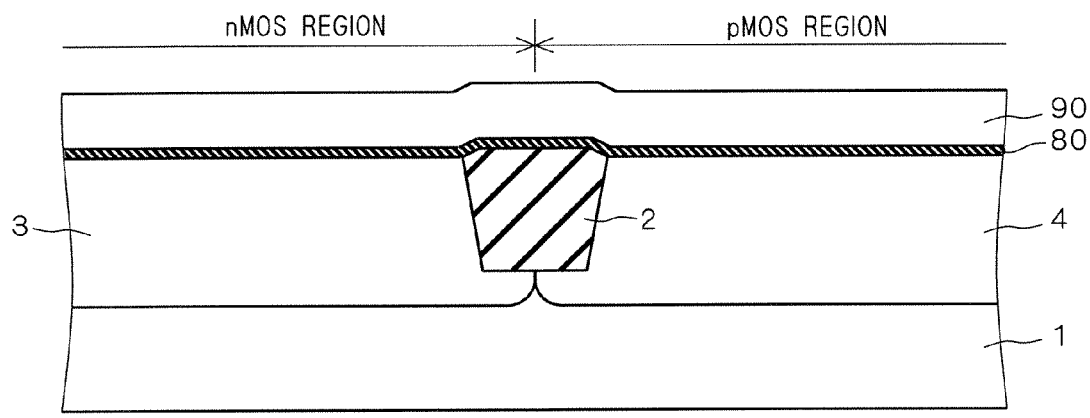
F I G . 5
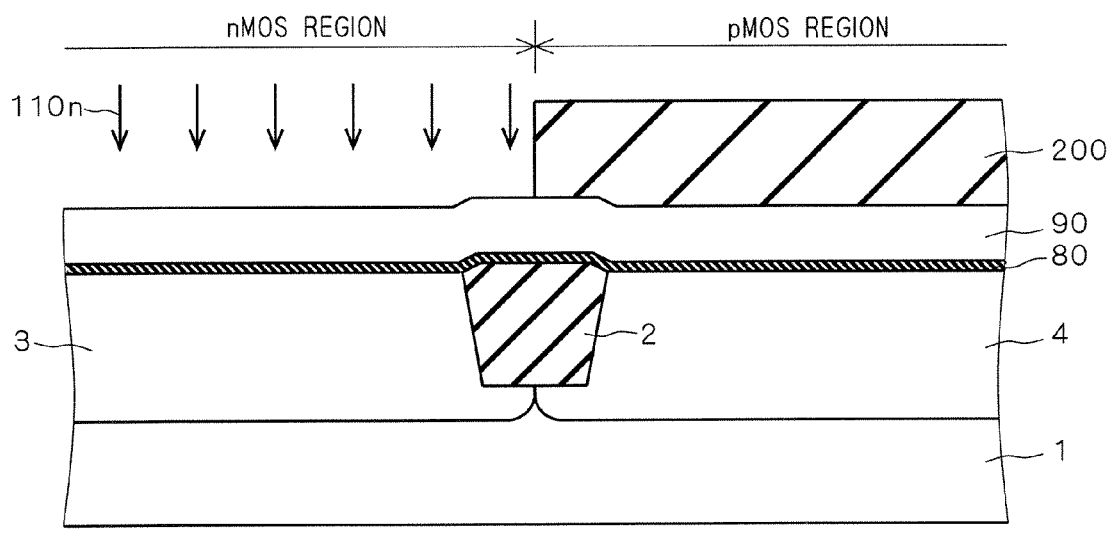

F I G. 3 1
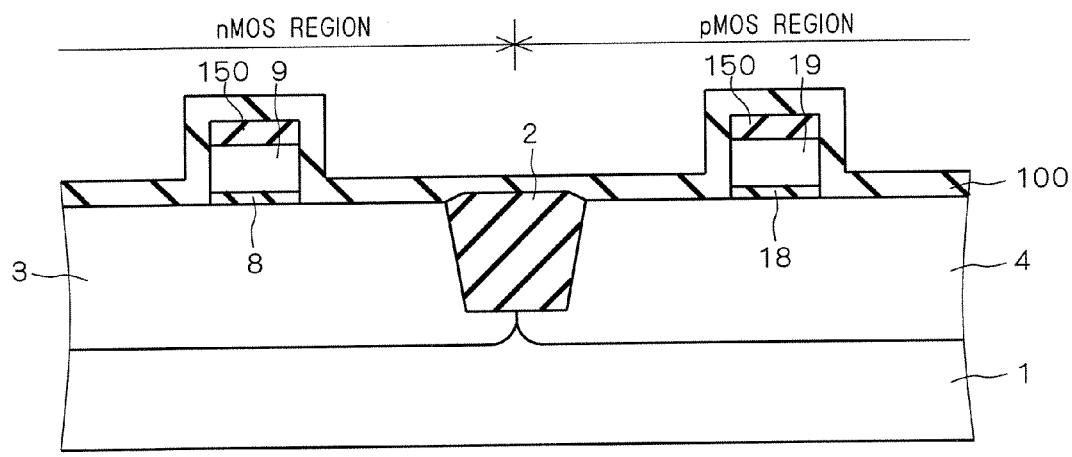
F I G. 3 2
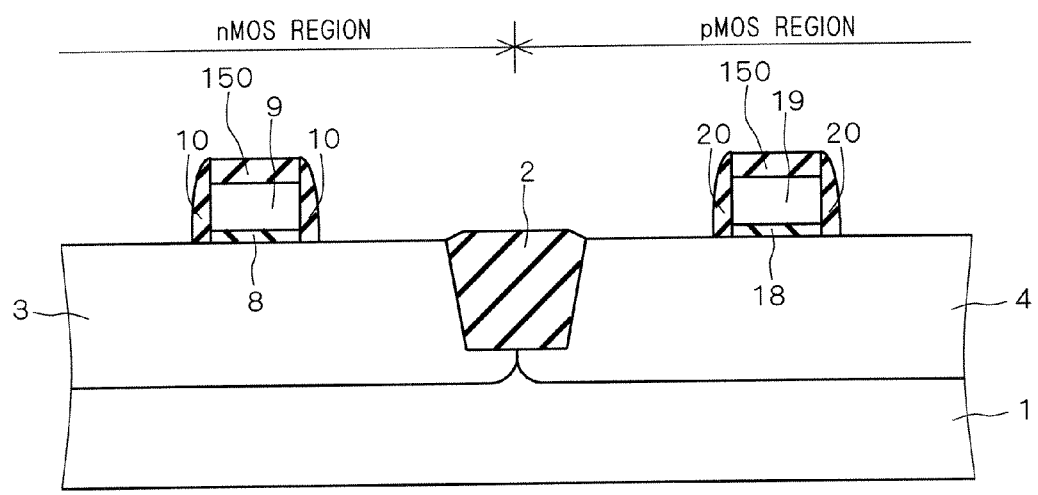
F I G. 3 3
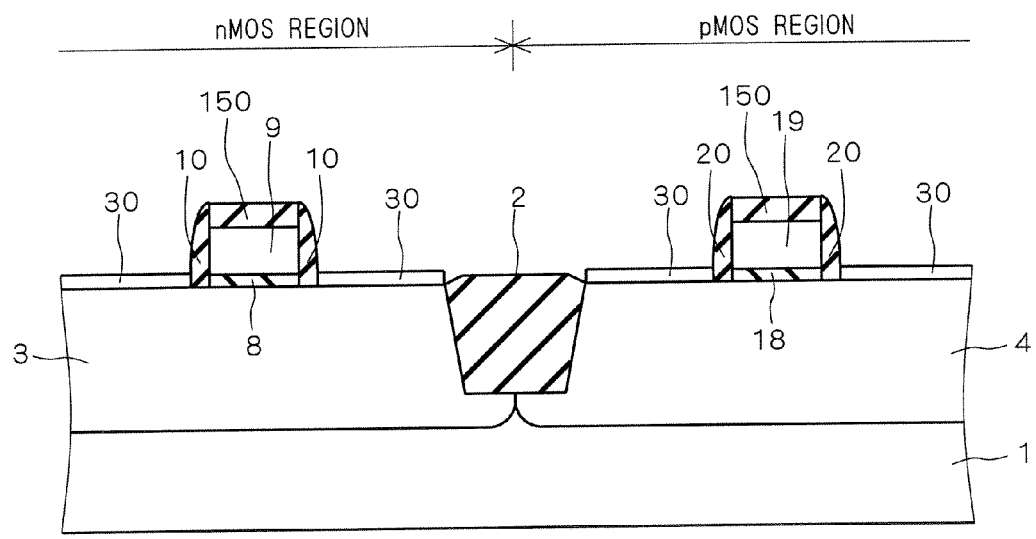

MANUFACTURING METHOD FOR FORMING ALL REGIONS OF THE GATE ELECTRODE SILICIDED

CROSS-REFERENCE TO RELATED APPLICATION

The present application claims priority from Japanese patent application No. 2005-197055 filed on Jul. 6, 2005, the content of which is hereby incorporated by reference into this application.

FIELD OF THE INVENTION

The present invention relates to a semiconductor device provided with a MOS transistor in which all the regions of the gate electrode are silicided, and its manufacturing method.

DESCRIPTION OF THE BACKGROUND ART

In the CMOS device represented by system-on-chip, densification and microfabrication are advanced every year, and the gate length of the MOS transistor is set to 0.1 μm or less, and has reached to tens of nm. On the other hand, thickness reduction of the gate insulating film of a MOS transistor is also advanced, and this thickness reduction technology is becoming indispensable for improvement in short channel characteristics and the rise of driving current of a MOS transistor as a generation progresses.

When making microfabrication of the transistor, the increase of gate leakage current accompanying the thickness reduction of a gate insulating film and the expansion of the depletion layer formed in the silicon substrate side in the gate electrode which includes polysilicon pose a problem. The increase in gate leakage current leads to the increase in the power consumption of the whole chip. With the mobile products represented by the cellular phone, while employment of a high-density CMOS device is required in order to correspond to advanced features, it is necessary to suppress gate leakage current low so that battery duration may not become short too much, either. Therefore, the attempt which uses materials with a high relative dielectric constant (it is hereafter called "high-k material"), such as aluminium oxide ($Al_2O_3$) and tantalum oxide ($Ta_2O_5$), is performed as a material of a gate insulating film. Expansion of the depletion layer formed in the gate electrode which includes polysilicon causes the thickness enhancement of the gate insulating film on appearance, and lowering of driving ability. Therefore, in order to make reduction of the width of the depletion layer concerned and to realize this, the amount of the impurity introduced into the gate electrode is made to increase, or using a metallic material in which a depletion layer does not generate as a gate electrode material is performed.

Generally, in order to make threshold voltage of a MOS transistor into a moderate value, it is necessary to choose a gate electrode material in which the work function to the silicon substrate has a moderate value. When a metal or a metallic compound is used as a gate electrode material in order to suppress the generation of a depletion layer, in order to set threshold voltage as a moderate value in each of an nMOS transistor and a pMOS transistor, it is usually necessary to change the gate electrode material used with those transistors. This makes the CMOS process complicated.

Then, the technology of preventing the generation of the depletion layer by siliciding the whole gate electrode while setting up appropriately the work function of the gate electrode in both transistors by using polysilicon as a gate electrode material and changing the conductivity type of the impurity which is introduced into the polysilicon concerned with the nMOS transistor and the pMOS transistor is proposed. The gate electrode with which all the regions were silicided is called a FUSI (FUlly SIlicided) gate electrode.

The technology regarding a FUSI gate electrode is disclosed in Nonpatent Literature 1. In Patent References 1-5, the technology regarding the MOS transistor which has a gate electrode including silicide is disclosed.

[Nonpatent Literature 1] B. Tavel et al., "Totally Silicided ($CoSi_2$) Polysilicon: a novel approach to very low-resistive gate(~2Ω/□) without metal CMP nor etching", International Electron Device Meeting 2001 (IEDM2001).

[Patent Reference 1] Japanese Unexamined Patent Publication No. 2002-319670

[Patent Reference 2] Japanese Unexamined Patent Publication No. Hei 8-46057

[Patent Reference 3] Japanese Unexamined Patent Publication No. Hei 7-245396

[Patent Reference 4] Japanese Unexamined Patent Publication No. Hei 11-121745

[Patent Reference 5] Japanese Unexamined Patent Publication No. Hei 1-183851

SUMMARY OF THE INVENTION

When manufacturing a MOS transistor provided with the above FUSI gate electrodes, after performing the silicidation of the source/drain region of the MOS transistor, all the regions of the gate electrode were silicided conventionally. Therefore, by the heat treatment performed in the case of the silicidation of the gate electrode, the silicide in the source/drain region may cohere and the electric resistance of the source/drain region concerned may rise.

Furthermore, by the generation of cohesion, the silicide in the source/drain region may break through the pn junction surface formed in the boundary of the silicon substrate and the source/drain region, it may become a configuration over both the silicon substrate and the source/drain region, and junction leak may increase.

On the other hand, in performing the silicidation of a source/drain region and a gate electrode simultaneously unlike a described method, usually, since the thickness of the gate electrode is very larger than the junction depth of the source/drain region, when all the regions of the gate electrode are silicided, the silicide layer in the source/drain region becomes deep too much, junction leak will go up or short channel characteristics will deteriorate.

By the heat treatment performed in the case of the silicidation of the gate electrode, the impurity in the source/drain region may be diffused toward the side of the channel region of the MOS transistor, and the short channel characteristics of the MOS transistor concerned may fall.

Then, the present invention is accomplished in view of the above-mentioned problem, and it aims at offering the technology which can be improved in the performance of a MOS transistor in which all the regions of the gate electrode were silicided.

The first manufacturing method of a semiconductor device of this invention comprises the steps of: (a) forming a gate insulating film and a gate electrode of a first MOS transistor over a semiconductor substrate, laminating in this order; (b) siliciding all regions of the gate electrode; (c) forming a source/drain region of the first MOS transistor in an upper surface of the semiconductor substrate; and (d) siliciding the source/drain region after the steps (b) and (c).

The second manufacturing method of a semiconductor device of this invention comprises the steps of: (a) forming a gate insulating film and a gate electrode of a first MOS transistor over a semiconductor substrate, laminating in this order; (b) siliciding the gate electrode partially; (c) forming a source/drain region of the first MOS transistor in an upper surface of the semiconductor substrate; and (d) siliciding simultaneously the source/drain region and all regions of a portion which is not silicided in the gate electrode after the steps (b) and (c).

The third manufacturing method of a semiconductor device of this invention comprises the steps of: (a) forming a gate insulating film and a gate electrode of a first MOS transistor over a semiconductor substrate, laminating in this order; (b) forming a semiconductor layer over the semiconductor substrate at a side of the gate insulating film and the gate electrode so that an upper surface may be located up rather than an upper surface of a portion over which the gate insulating film is formed in the semiconductor substrate; (c) forming a source/drain region of the first MOS transistor in the semiconductor layer; (d) siliciding the source/drain region; and (e) siliciding all regions of the gate electrode after the step (d).

The first semiconductor device of this invention comprises: a semiconductor substrate; and a MOS transistor formed over the semiconductor substrate; wherein the MOS transistor includes: a source/drain region in which a silicide layer is formed; and a gate electrode with which all regions are formed with silicide which excels the silicide layer of the source/drain region in thermostability.

The second semiconductor device of this invention comprises: a semiconductor substrate; and a MOS transistor formed over the semiconductor substrate; wherein the MOS transistor includes: a source/drain region in which a silicide layer is formed; and a gate electrode with which all regions are formed with silicide; wherein what generates a silicide reaction at low temperature rather than a metallic material of the silicide of the gate electrode is used for a metallic material of the silicide layer of the source/drain region.

The third semiconductor device of this invention comprises: a semiconductor substrate; and a first and a second MOS transistors formed over the semiconductor substrate; wherein the first MOS transistor has a source/drain region in which a silicide layer is formed, and a gate electrode with which all regions are formed with silicide including n type impurities; the second MOS transistor has a source/drain region in which a silicide layer is formed, and a gate electrode with which all regions are formed with silicide including p type impurities; and the gate electrode of the second MOS transistor is formed more thinly than the gate electrode of the first MOS transistor.

The fourth semiconductor device of this invention comprises: a semiconductor substrate; and a first MOS transistor formed over the semiconductor substrate; wherein the first MOS transistor includes: a gate electrode which is formed via a gate insulating film over the semiconductor substrate, and with which all regions include silicide; and a source/drain region which includes a silicide layer formed over the semiconductor substrate in a top end; wherein an upper surface of the silicide layer is located in 5 nm or more upper part rather than an upper surface of a portion over which the gate insulating film is formed in the semiconductor substrate.

According to the first manufacturing method of a semiconductor device of this invention, since a silicidation of a source/drain region is performed after a silicidation of a gate electrode, in the case of the silicidation of the gate electrode, silicide does not exist in the source/drain region. Therefore, silicide does not cohere in the source/drain region by the heat treatment by the silicidation of the gate electrode. Therefore, the adverse effect by cohesion of silicide can be eliminated, and junction leak can be reduced while being able to reduce the electric resistance of the source/drain region. As a result, the performance of the first MOS transistor can be improved.

According to the second manufacturing method of a semiconductor device of this invention, since a silicidation of a source/drain region is performed after a partial silicidation of a gate electrode, in the case of the partial silicidation of the gate electrode, silicide does not exist in the source/drain region. Therefore, silicide does not cohere in the source/drain region by the heat treatment by the partial silicidation of the gate electrode. Since the silicidation of the remaining portion of the gate electrode and the silicidation of the source/drain region are performed simultaneously, in the silicidation of the remaining portion of the gate electrode, silicide does not cohere in the source/drain region. Therefore, the adverse effect by cohesion of silicide can be eliminated, and junction leak can be reduced while being able to reduce the electric resistance of the source/drain region. As a result, the performance of the first MOS transistor can be improved.

According to the third manufacturing method of a semiconductor device of this invention, since a semiconductor layer is formed on a semiconductor substrate and a source/drain region is formed in the semiconductor layer, it becomes difficult for the impurities in the source/drain region to diffuse to the channel region of the first MOS transistor by the heat treatment by the silicidation of the gate electrode. Therefore, degradation of the short channel characteristics in the first MOS transistor can be prevented, and the performance can be improved.

Since the source/drain region formed in the semiconductor layer is silicided, the silicide layer in the source/drain region can be thickly formed by adjusting the thickness of the semiconductor layer. Since it will be hard to be influenced by heat treatment when the silicide layer is thick, it becomes difficult to generate cohesion of silicide. Therefore, the cohesion generated in the silicide layer of the source/drain region by the heat treatment by the silicidation of the gate electrode can be suppressed. Therefore, the rise of the electric resistance of the source/drain region and the increase in junction leak can be suppressed, and the performance of the first MOS transistor can be improved.

According to the first semiconductor device of this invention, since silicide of a gate electrode excels a silicide layer of a source/drain region in thermostability, when performing the silicidation of the source/drain region after the silicidation of the gate electrode, it can be prevented that the electrical property of the gate electrode changes with the heat treatments by the silicidation of the source/drain region. Therefore, the performance of the MOS transistor can be improved.

According to the second semiconductor device of this invention, since silicidation of a source/drain region can be performed at low temperature, when performing the silicidation of the source/drain region after the silicidation of a gate electrode, it can be prevented that the electrical property of the gate electrode changes by the heat treatment by the silicidation of the source/drain region. Therefore, the performance of the MOS transistor can be improved.

According to the third semiconductor device of this invention, a gate electrode of the second MOS transistor in which p type impurities were introduced is formed more thinly than a gate electrode of the first MOS transistor in which n type impurities were introduced. Generally, in a gate electrode into which p type impurities, such as a boron, were introduced, the speed of advance of the silicide reaction becomes slow.

Therefore, the silicidation to the gate electrode in which the p type impurities were introduced, and the silicidation to the gate electrode in which the n type impurities were introduced can be ended almost simultaneously like the present invention by forming thinly the gate electrode with which the silicide reaction advances late. Therefore, the gate electrode in which the n type impurities were introduced is not exposed to the heat treatment more than needed, and the rise of the electric resistance of the gate electrode concerned can be suppressed. As a result, the performance of the second MOS transistor can be improved.

According to the fourth semiconductor device of this invention, since an upper surface of a silicide layer of a source/drain region is located in the 5 nm or more upper part rather than the upper surface of the portion on which a gate insulating film is formed in a semiconductor substrate, the area of the boundary region of the source/drain region concerned and the channel region of the first MOS transistor can be reduced maintaining the thickness of the whole source/drain region including the silicide layer. Therefore, it becomes difficult for the impurities in the source/drain region to diffuse to the channel region of the first MOS transistor by the heat treatment at the time of siliciding the gate electrode. Therefore, degradation of the short channel characteristics of the first MOS transistor can be prevented, and the performance can be improved.

Since the upper surface of the silicide layer of the source/drain region is located in the 5 nm or more upper part rather than the upper surface of the portion on which the gate insulating film is formed in the semiconductor substrate, thickness of the silicide layer can be thickened. Since it will be hard to be influenced by heat treatment when the silicide layer is thick, it becomes difficult to generate cohesion of silicide. Therefore, when siliciding the gate electrode after siliciding the source/drain region, the cohesion generated in the silicide layer of the source/drain region by the heat treatment by the silicidation of the gate electrode can be suppressed. Therefore, the rise of the electric resistance in the source/drain region and the increase in junction leak can be suppressed, and the performance of the first MOS transistor can be improved.

BRIEF DESCRIPTION OF THE DRAWINGS

FIGS. 2 to 16 are cross-sectional views showing the manufacturing method of the semiconductor device concerning Embodiment 1 of the present invention at process order;

FIGS. 29 to 39 are cross-sectional views showing the manufacturing method of the semiconductor device concerning Embodiment 2 of the present invention at process order;

DETAILED DESCRIPTION OF THE PREFERRED EMBODIMENTS

Embodiment 1

Figure 1:
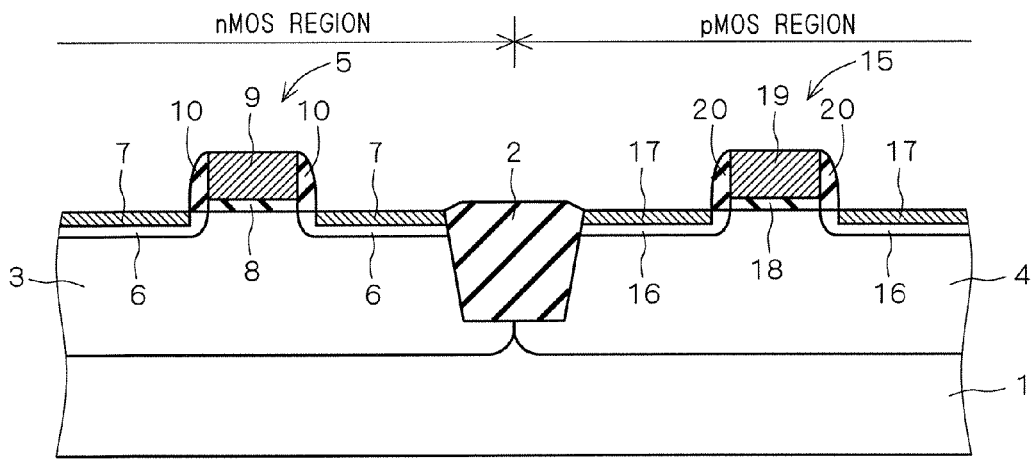
FIG. 1 is a cross-sectional view showing the structure of the semiconductor device concerning Embodiment 1 of the present invention.

FIG. 1 is a cross-sectional view showing the structure of the semiconductor device concerning Embodiment 1 of the present invention. As shown in FIG. 1, the semiconductor device concerning Embodiment 1 is provided with the nMOS region in which nMOS transistor 5 is formed, and the pMOS region in which pMOS transistor 15 is formed. In the semiconductor device concerning Embodiment 1, semiconductor substrate 1 which is a p type silicon substrate, for example is formed. In the upper surface of semiconductor substrate 1 in the boundary of the nMOS region and the pMOS region, element isolation insulating film 2 which includes a silicon oxide film, for example is formed, and nMOS transistor 5 and pMOS transistor 15 are electrically separated by the element isolation insulating film 2 concerned. Element isolation insulating film 2 concerning Embodiment 1 is formed by the trench isolation method.

P type well region 3 is formed in the upper surface of semiconductor substrate 1 in an nMOS region, and n type well region 4 is formed in the upper surface of semiconductor substrate 1 in a pMOS region. In the upper surface of p type well region 3, two source/drain regions 6 of nMOS transistor 5 are formed, separating mutually, and in the upper surface of n type well region 4, two source/drain regions 16 of pMOS transistor 15 are formed, separating mutually. And silicide layer 7 is formed in the upper surface of source/drain region 6, and silicide layer 17 is formed in the upper surface of source/drain region 16.

Source/drain region 6 of nMOS transistor 5 is an n type impurity region, and source/drain region 16 of pMOS transistor 15 is a p type impurity region. Each of silicide layers 7 and 17 includes nickel silicide, cobalt silicide, platinum silicide, titanium silicides, or molybdenum silicide, for example.

On the upper surface of p type well region 3 between source/drain regions 6, gate insulating film 8 and gate electrode 9 of nMOS transistor 5 are laminated in this order, and sidewall 10 is formed on the both side surfaces of gate insulating film 8 and gate electrode 9. On the upper surface of n type well region 4 between source/drain regions 16, gate insulating film 18 and gate electrode 19 of pMOS transistor 15 are laminated in this order, and sidewall 20 is formed on the both side surfaces of gate insulating film 18 and gate electrode 19.

Each of gate electrodes 9 and 19 is a FUSI gate electrode, and those all regions include silicide, such as nickel silicide, cobalt silicide, platinum silicide, titanium silicides, and molybdenum silicide. Each of gate insulating films 8 and 18 includes high-k materials, such as aluminium oxide, for example, and each of sidewalls 10 and 20 includes a silicon nitride film. At Embodiment 1, the CMOS transistor includes nMOS transistor 5 and pMOS transistor 15.

Figure 2:
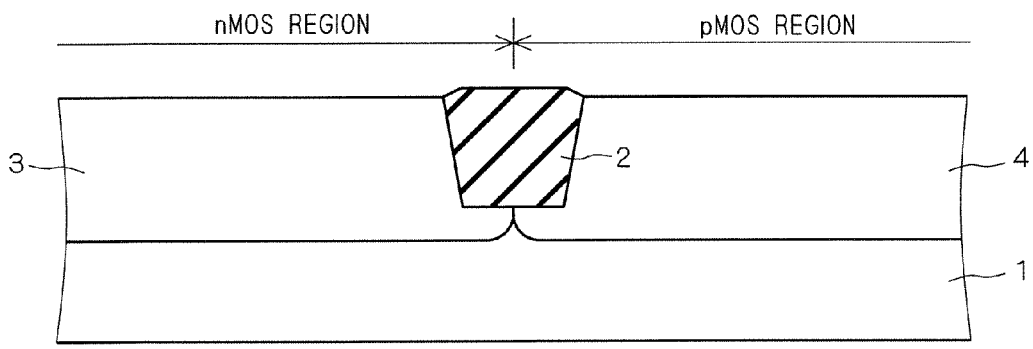

Next, the manufacturing method of the semiconductor device shown in FIG. 1 is explained. FIGS. 2-16 are the cross-sectional views showing the manufacturing method of the semiconductor device concerning Embodiment 1 at process order. First, as shown in FIG. 2, while forming element isolation insulating film 2 in the upper surface of semiconductor substrate 1, p type well region 3 and n type well region 4 are formed.

Figure 3:
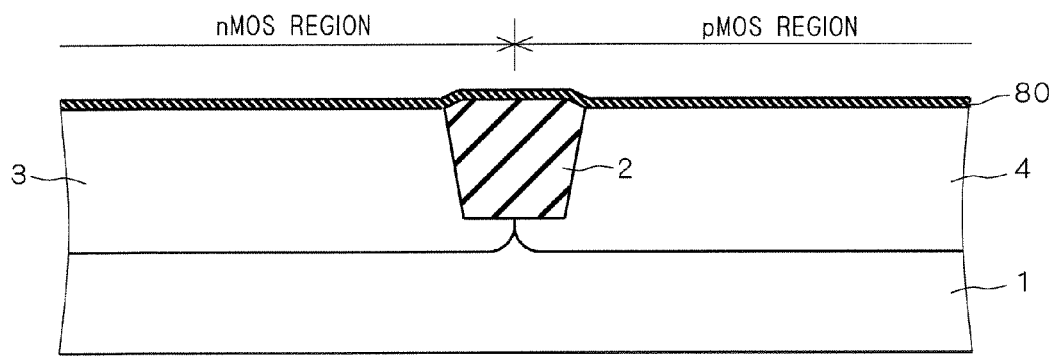

Next, as shown in FIG. 3, insulating film 80 which turns into gate insulating films 8 and 18 at a later step is formed at the whole surface. And as shown in FIG. 4, polysilicon film 90 which serves as gate electrodes 9 and 19 at a later step is formed on insulating film 80 at the whole surface.

Next, as shown in FIG. 5, photoresist 200 is formed on polysilicon film 80 in a pMOS region, the photoresist 200 concerned is used for a mask, and n type impurities 110n, such as arsenic and phosphorus, are introduced by ion-implantation into polysilicon film 90 in an nMOS region. Then, photoresist 200 is removed.

Figure 6:
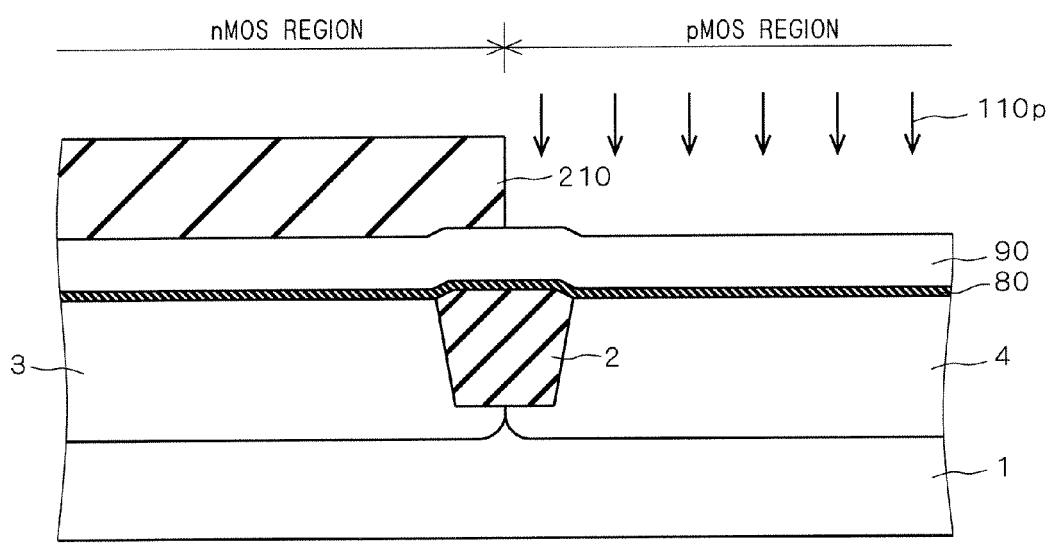

Next, as shown in FIG. 6, photoresist 210 is formed on polysilicon film 80 in an nMOS region, the photoresist 210 concerned is used for a mask, and p type impurities 110p, such as boron and aluminium, are introduced by ion-implantation into polysilicon film 90 in a pMOS region. Then, photoresist 210 is removed.

Figure 7:
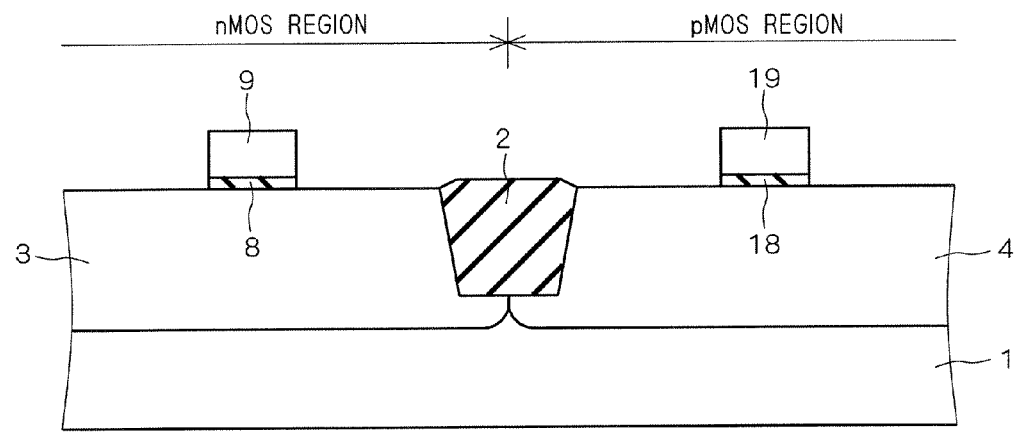

Next, as shown in FIG. 7, polysilicon film 90 and insulating film 80 are patterned one by one, and gate electrodes 9 and 19 which include polysilicon film 90, respectively, and gate insulating films 8 and 18 which include insulating film 80, respectively are formed. And the extension regions of nMOS transistor 5 and pMOS transistor 15 are formed in p type well region 3 and n type well region 4, respectively, and pocket implantation is performed after that.

Figure 8:
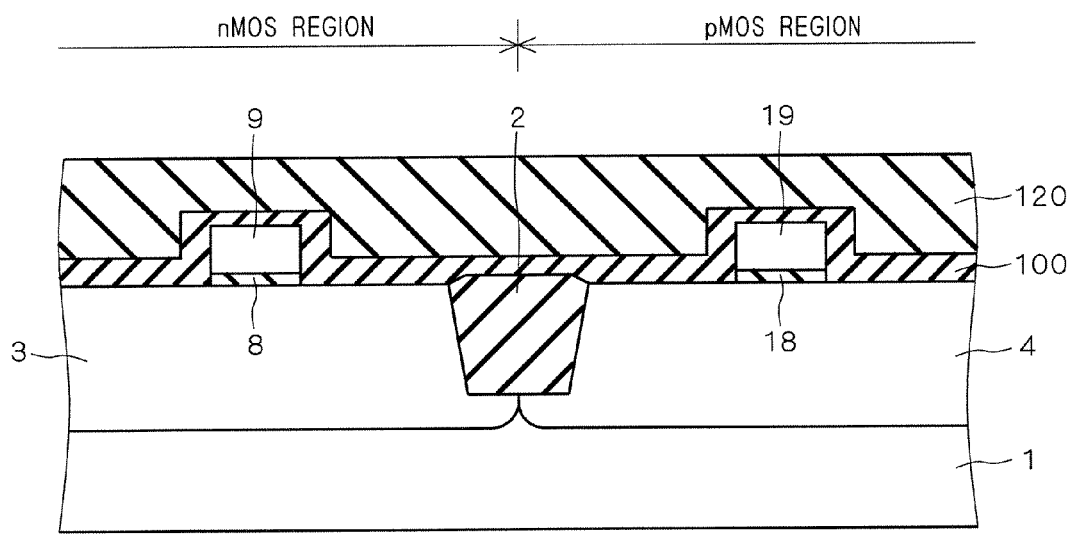

Next, as shown in FIG. 8, insulating film 100 used as a sidewall is formed at the whole surface, covering gate insulating films 8 and 18 and gate electrodes 9 and 19. And silicon oxide film 120 is formed on insulating film 100 at the whole surface. Insulating film 100 includes a silicon nitride film, for example.

Figure 9:
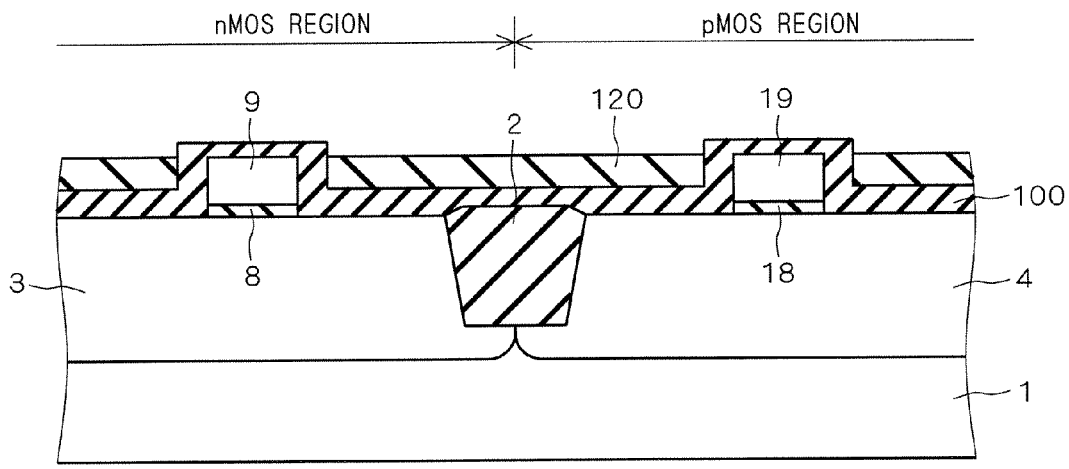

Next, as shown in FIG. 9, silicon oxide film 120 is polished by the CMP method from the upper surface, using insulating film 100 as a stopper film. Hereby, silicon oxide film 120 is removed partially and the upper surface of the portion located on gate electrode 9 and the upper surface of the portion located on gate electrode 19 are exposed in insulating film 100.

Figure 10:
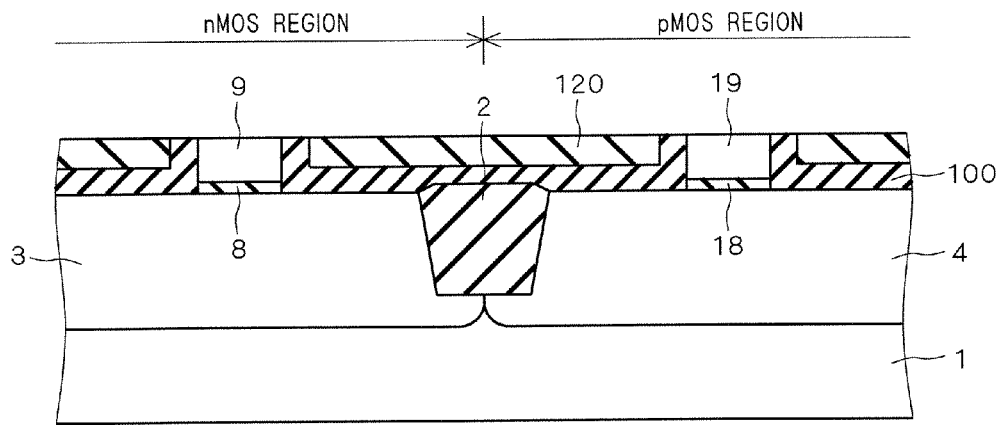

Next, as shown in FIG. 10, exposed insulating film 100 is selectively removed using a dry etching method which has selectivity to silicon oxide film 120, and each upper surface of gate electrodes 9 and 19 is exposed. At this time, silicon oxide film 120 functions as a protective film to insulating film 100 which has not been exposed.

Figure 11:
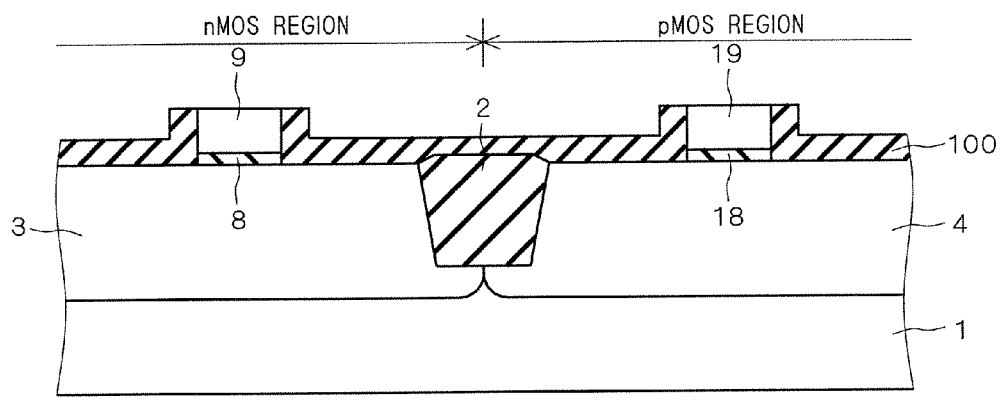
Figure 12:
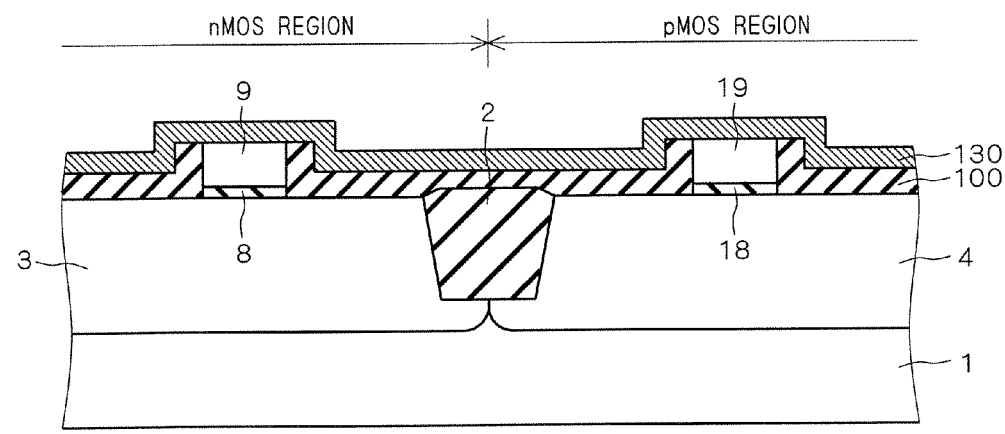
Figure 13:
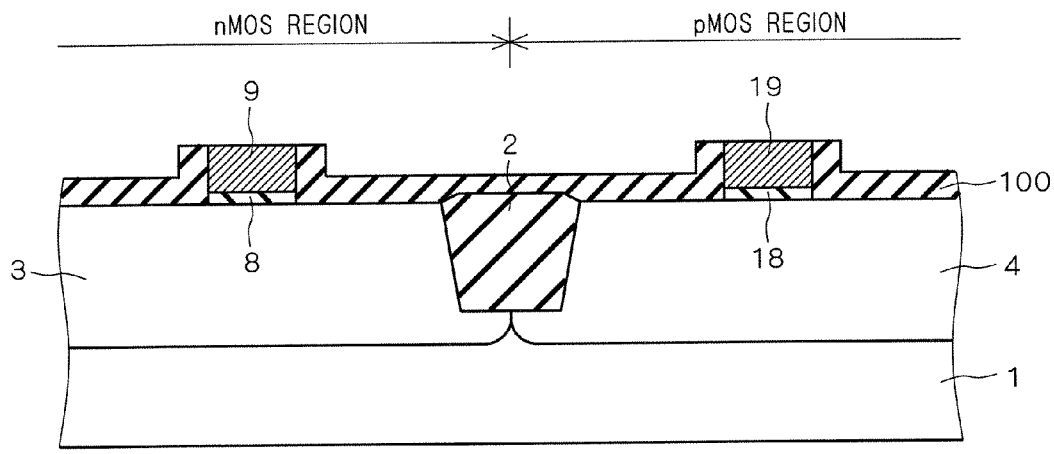

Next, as shown in FIG. 11, silicon oxide film 120 is selectively removed using a wet etching method. And as shown in FIG. 12, in order to silicide gate electrodes 9 and 19, metallic materials 130, such as nickel (Ni), cobalt (Co), platinum (Pt), titanium (Ti), and molybdenum (Mo), are deposited at the whole surface, and a heat treatment is performed to the acquired structure. Metallic material 130 and the silicon in contact with it react by this, and all the regions of gate electrodes 9 and 19 which include polysilicon are silicided. Then, unreacted metallic material 130 is removed. Hereby, as shown in FIG. 13, gate electrodes 9 and 19 of FUSI gate electrodes are completed.

Figure 14:
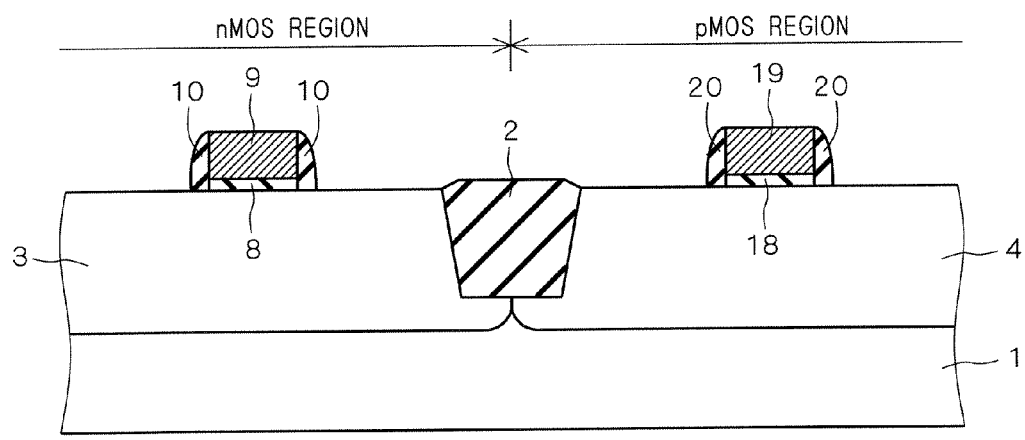

Next, as shown in FIG. 14, insulating film 100 is selectively etched using an anisotropic dry etching method with which the etching rate is high to the thickness direction of semiconductor substrate 1. By this, insulating film 100 is removed partially, sidewall 10 which includes insulating film 100 is completed on the side face of gate insulating film 8 and gate electrode 9, and sidewall 20 which includes insulating film 100 is completed on the side face of gate insulating film 18 and gate electrode 19.

Figure 15:
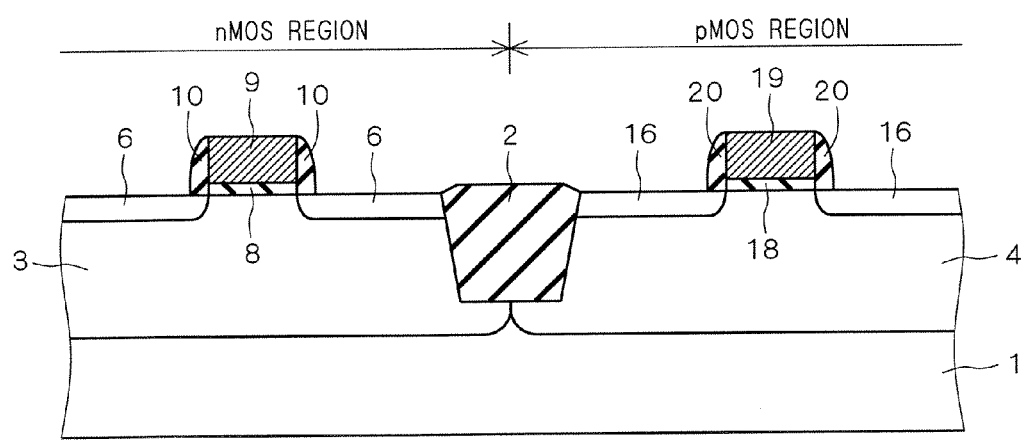
Figure 16:
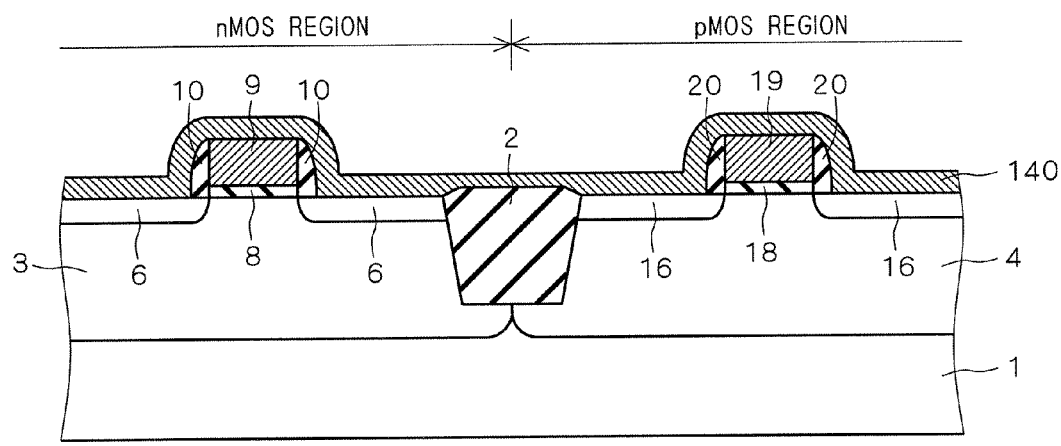

Next, as shown in FIG. 15, in p type well region 3, an n type, high-concentration impurity is introduced by ion-implantation, source/drain region 6 is formed, in n type well region 4, a p type high-concentration impurity is introduced by ion-implantation, and source/drain region 16 is formed. Then, as shown in FIG. 16, in order to silicide source/drain regions 6 and 16, metallic materials 140, such as nickel, cobalt, platinum, titanium, and molybdenum, are deposited at the whole surface, and a heat treatment is performed to the acquired structure. Metallic material 140 and the silicon in contact with it react by this, each of source/drain regions 6 and 16 is silicided, and silicide layers 7 and 17 are formed. Then, unreacted metallic material 140 is removed. As a result, the semiconductor device shown in FIG. 1 is completed. In Embodiment 1, the same material as metallic material 130 is used for metallic material 140.

As mentioned above, in the manufacturing method of the semiconductor device concerning Embodiment 1, the silicidation of source/drain regions 6 and 16 is performed after the silicidation to gate electrodes 9 and 19. Therefore, in the case of the silicidation of gate electrodes 9 and 19, silicide does not exist in source/drain regions 6 and 16. Therefore, silicide does not cohere in source/drain regions 6 and 16 by the heat treatment in the case of the silicidation of gate electrodes 9 and 19. Therefore, junction leak can be reduced, while being able to eliminate the adverse effect by silicide cohering and being able to reduce the electric resistance of source/drain regions 6 and 16. As a result, the performance of nMOS transistor 5 or pMOS transistor 15 can be improved.

Since the thickness of gate electrodes 9 and 19 is very larger than the diffusion depth of source/drain regions 6 and 16, the heat treating time in the silicidation of source/drain regions 6 and 16 is usually very shorter than the heat treating time in the silicidation of gate electrodes 9 and 19. Generally, the more the volume of silicide is large, the more it is hard to generate the cohesion by heat. From these reasons, in gate electrode 9 and 19, cohesion of silicide hardly arises by the heat treatment by the silicidation of source/drain regions 6 and 16. Therefore, the heat treatment by the silicidation of source/drain regions 6 and 16 hardly affects the electrical property of gate electrodes 9 and 19, and does not pose a problem.

Although source/drain regions 6 and 16 are silicided after siliciding all the regions of gate electrodes 9 and 19 in the manufacturing method concerning above-mentioned Embodiment 1, source/drain regions 6 and 16, and the remaining portion of gate electrodes 9 and 19 may be silicided simultaneously after siliciding gate electrodes 9 and 19 partially. Below, the manufacturing method in this case is explained.

Figure 17:
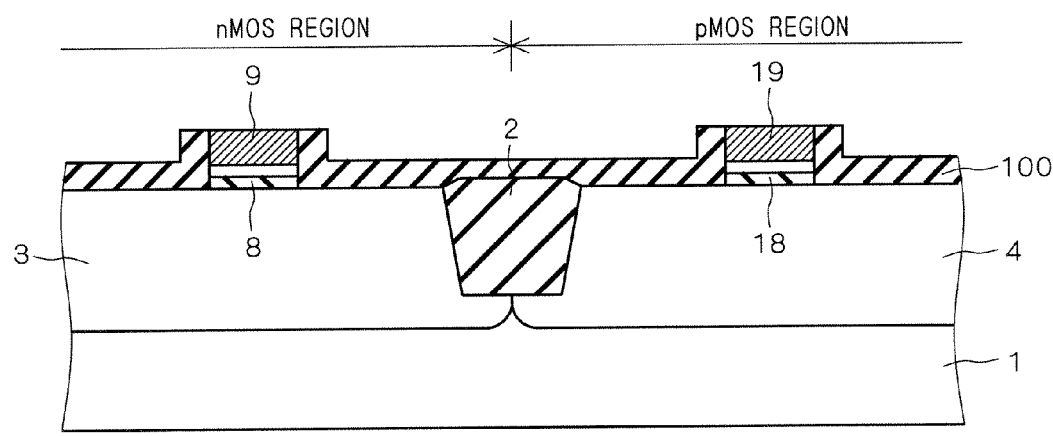
FIGS. 17 to 20 are cross-sectional views showing the first modification of the manufacturing method of the semiconductor device concerning Embodiment 1 of the present invention at process order.

FIGS. 17-20 are the cross-sectional views showing the modification of the manufacturing method of the semiconductor device concerning Embodiment 1 at process order. First, the manufacture is made to the structure shown in FIG. 12 using the above-mentioned manufacturing method. And a heat treatment is performed to the acquired structure, and as shown in FIG. 17, gate electrodes 9 and 19 are silicided partially. This partial silicidation is realizable by adjusting the thickness and heat treating time of metallic material 130. Then, unreacted metallic material 130 is removed.

Figure 18:
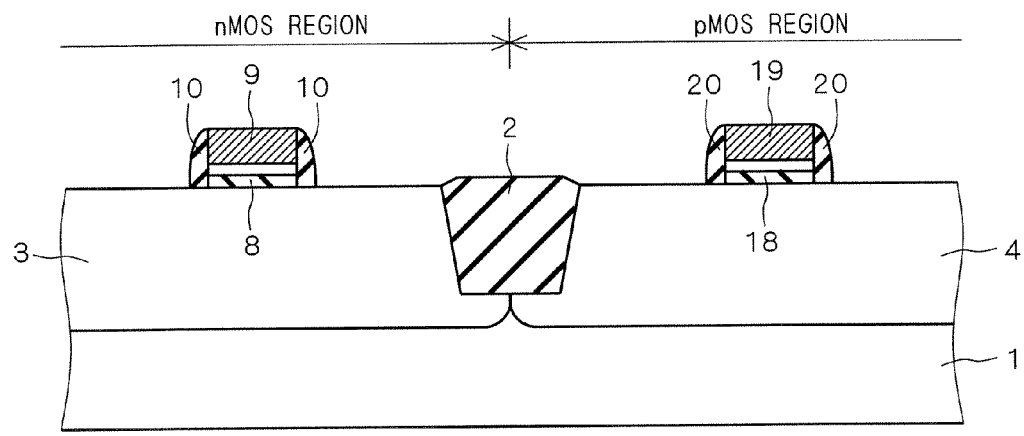
Figure 19:
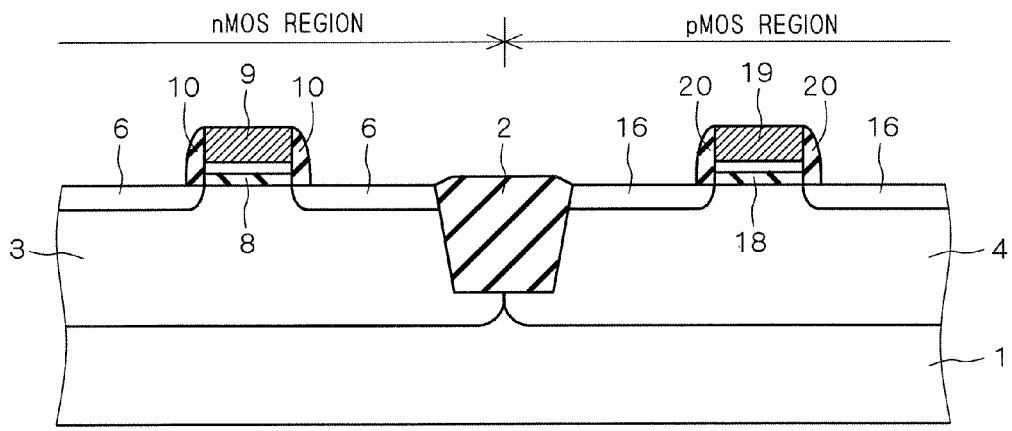

Next, as shown in FIG. 18, sidewalls 10 and 20 are formed, etching insulating film 100 like an above-mentioned method, and as shown in FIG. 19 after that, source/drain regions 6 and 16 are formed like an above-mentioned method.

Figure 20:
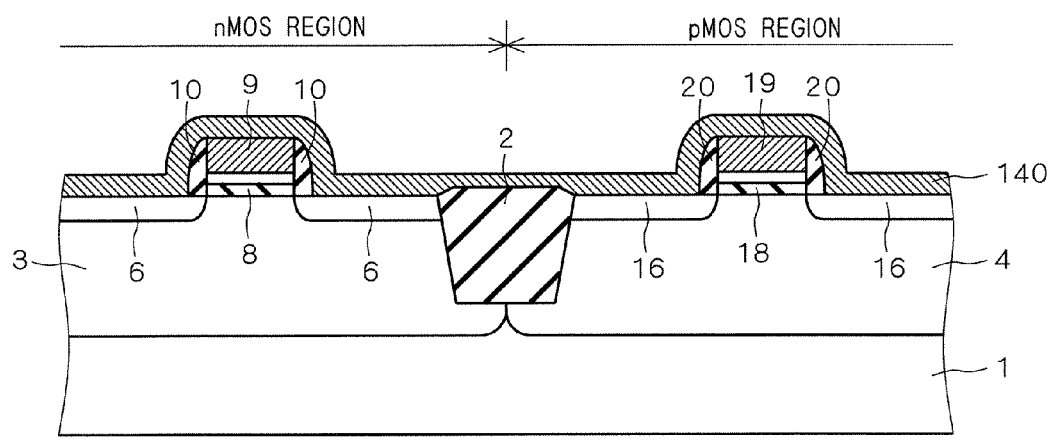

Next, as shown in FIG. 20, metallic material 140 is formed at the whole surface, and a heat treatment is performed to the acquired structure. Hereby, source/drain regions 6 and 16 are silicided, and simultaneously all the regions of the portion which is not yet silicided of gate electrodes 9 and 19 are silicided. Then, removal of unreacted metallic material 140 will acquire the same structure as the semiconductor device shown in FIG. 1.

Thus, in siliciding simultaneously source/drain regions 6 and 16, and the remaining portion of gate electrodes 9 and 19 after siliciding gate electrodes 9 and 19 partially, in the case of the silicidation of the beginning of gate electrodes 9 and 19, since silicide does not exist in source/drain regions 6 and 16, silicide does not cohere in source/drain regions 6 and 16 by the heat treatment in the case of the silicidation of the beginning of gate electrodes 9 and 19. Since the silicidation of the remaining portion of gate electrodes 9 and 19 and the silicidation of source/drain regions 6 and 16 are performed simultaneously, in the silicidation of the remaining portion of gate electrodes 9 and 19, silicide does not cohere in source/drain regions 6 and 16. Therefore, the adverse effect by silicide cohering can be eliminated and the performance of nMOS transistor 5 or pMOS transistor 15 can be improved.

Different materials may be used although the same material is used in Embodiment 1 as to metallic material 130 used when siliciding gate electrodes 9 and 19 and metallic material 140 used when siliciding source/drain regions 6 and 16. Hereby, selection of a suitable metallic material is attained in each of gate electrodes 9 and 19 and source/drain regions 6 and 16.

For example, when cobalt is used as metallic material 130 and nickel and palladium are used as metallic material 140, gate electrodes 9 and 19 are formed by cobalt silicide, and silicide layers 7 and 17 of source/drain regions 6 and 16 come to be formed by nickel silicide or palladium silicide. Generally, since cobalt silicide excels nickel silicide and palladium silicide in thermostability, an electrical property seldom changes with heat treatments. Therefore, it can be suppressed that the electrical property of gate electrodes 9 and 19 changes in the case of the heat treatment by the silicidation of source/drain regions 6 and 16. As a result, the performance of nMOS transistor 5 and pMOS transistor 15 can be improved further.

Since nickel and palladium generate a silicide reaction at low temperature rather than cobalt, when cobalt is used as metallic material 130 and nickel and palladium are used as metallic material 140, the silicidation of source/drain regions 6 and 16 can be performed at low temperature rather than the silicidation of gate electrodes 9 and 19. Therefore, it can be suppressed that the silicide in gate electrode 9 and 19 coheres with the heat treatments by the silicidation of source/drain regions 6 and 16, and it can be prevented that the electrical property of the gate electrodes 9 and 19 concerned changes. As a result, the performance of nMOS transistor 5 and pMOS transistor 15 can be improved further.

It is more desirable to use palladium rather than nickel as metallic material 140, since the case of using palladium as metallic material 140 generates a silicide reaction at further low temperature rather than the case where nickel is used.

Although silicon oxide film 120 was used as a protective film to the portion where insulating film 100 has not exposed and the portion where insulating film 100 has exposed is selectively removed in Embodiment 1 in the step shown in FIG. 10, photoresist 220 may be used as a protective film instead of silicon oxide film 120. Below, the manufacturing method in this case is explained.

Figure 21:
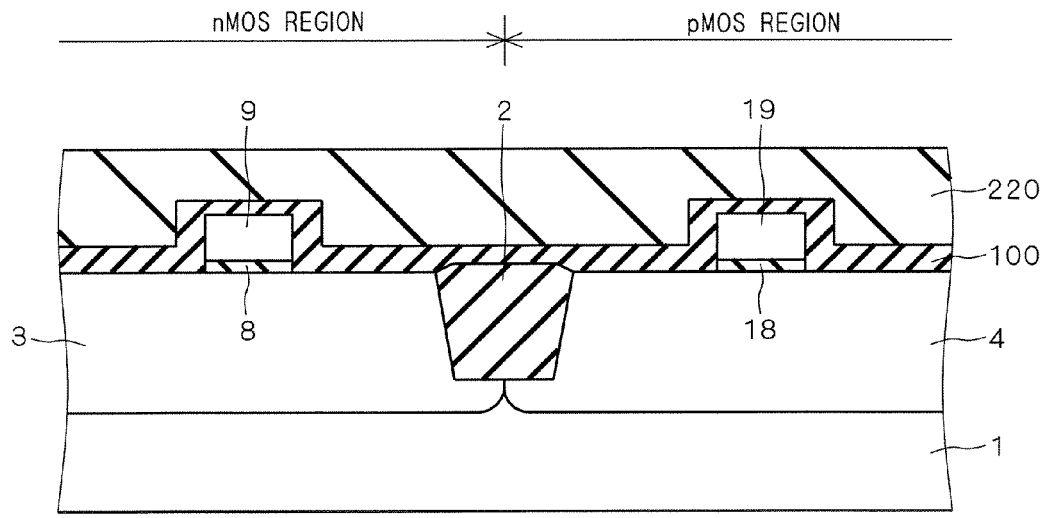
FIGS. 21 to 23 are cross-sectional views showing the second modification of the manufacturing method of the semiconductor device concerning Embodiment 1 of the present invention at process order.
Figure 22:
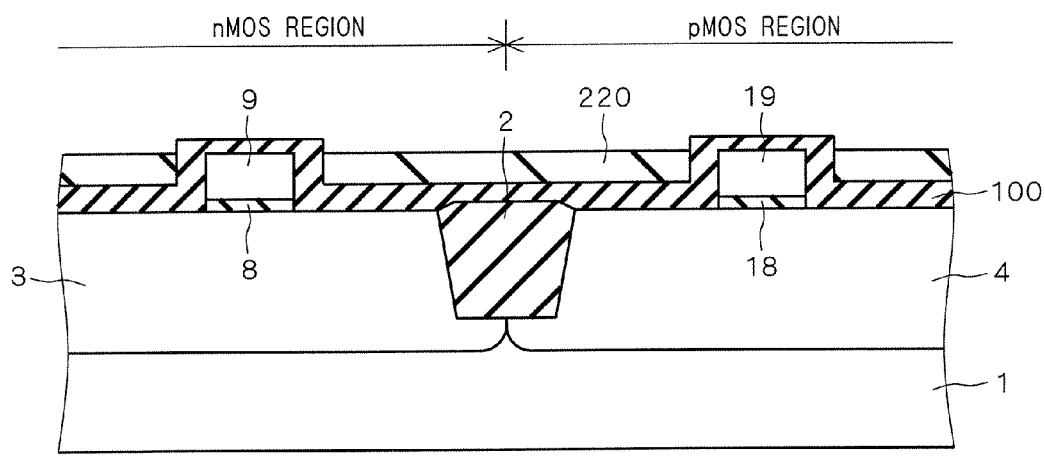
Figure 23:
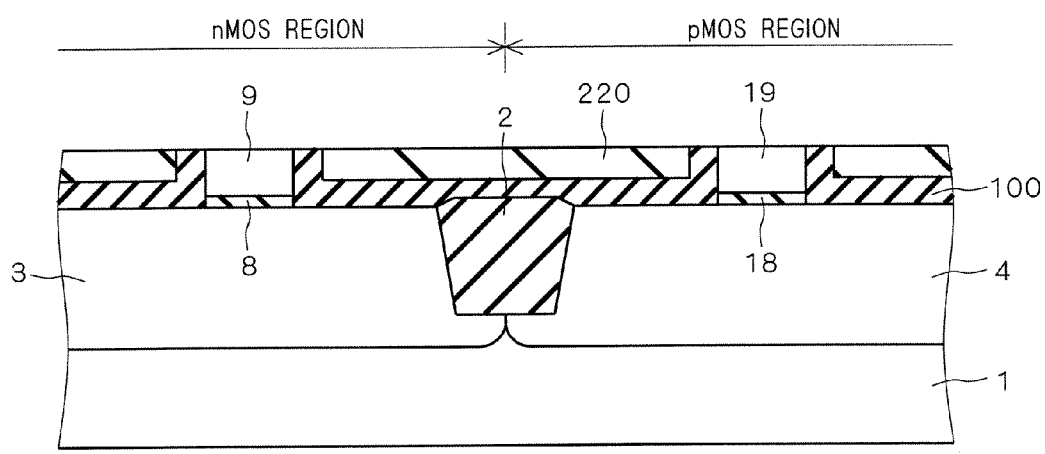

FIGS. 21-23 are the drawings showing another modification of the manufacturing method of the semiconductor device concerning Embodiment 1 at process order. First, the manufacture is made to the structure shown in FIG. 7 using the above-mentioned manufacturing method. And as shown in FIG. 21, insulating film 100 used as a sidewall is formed at the whole surface, covering gate insulating films 8 and 18 and gate electrodes 9 and 19, and photoresist 220 is formed on insulating film 100 after that at the whole surface.

Next, as shown in FIG. 22, photoresist 220 is selectively and partially removed using a dry etching method, and the upper surface of the portion located on gate electrode 9 and the upper surface of the portion located on gate electrode 19 are exposed in insulating film 100.

Next, as shown in FIG. 23, using a dry etching method which has selectivity to photoresist 220, the exposing portion of insulating film 100 is removed selectively, and each upper surface of gate electrodes 9 and 19 is exposed. Then, the remaining photoresist 220 is removed selectively.

Thus, the alternative of a material employable as insulating film 100 used as sidewalls 10 and 20 is expanded by using photoresist 220 as a protective film to the portion where insulating film 100 has not exposed. Like the above-mentioned manufacturing method, when silicon oxide film 120 is used as a protective film, in order to secure selectivity, a silicon oxide film cannot be used as a material of insulating film 100. On the other hand, when photoresist 220 is used as a protective film, a silicon oxide film can be used as a material of insulating film 100. Therefore, insulating film 100 used as sidewalls 10 and 20 can be formed by a single layer film, such as a silicon oxide film and a silicon nitride film, the two layer film of a silicon nitride film and a silicon oxide film, or three layer film of a silicon oxide film, a silicon nitride film, and a silicon oxide film, and the width of the material selection of sidewalls 10 and 20 spreads.

In Embodiment 1, although gate electrode 9 of nMOS transistor 5 including n type impurities $110n$ is formed by the same thickness as gate electrode 19 of pMOS transistor 15 including p type impurities $110p$, gate electrode 19 may be formed more thinly than gate electrode 9. The manufacturing method in this case is explained below.

Figure 24:
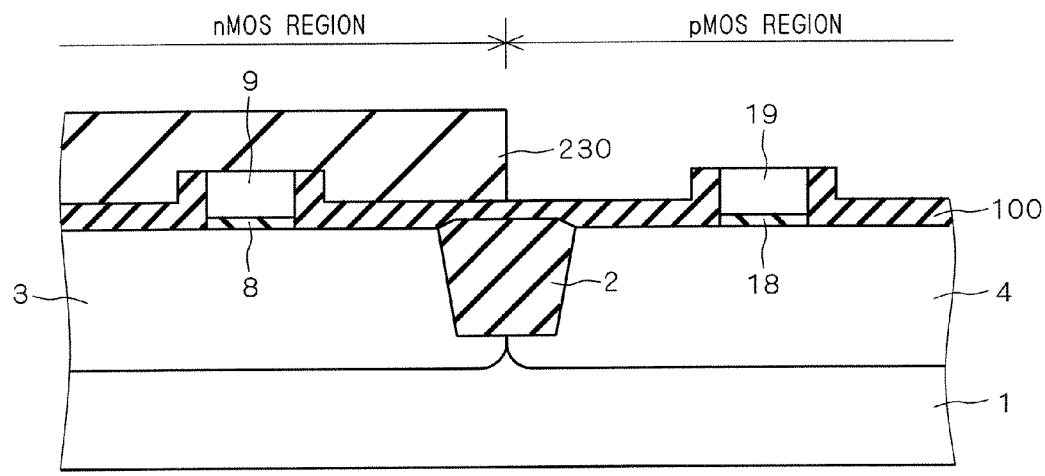
FIGS. 24 to 27 are cross-sectional views showing the third modification of the manufacturing method of the semiconductor device concerning Embodiment 1 of the present invention at process order.

FIGS. 24-27 are the cross-sectional views showing another modification of the manufacturing method of the semiconductor device concerning Embodiment 1 at process order. First, the manufacture is made to the structure shown in FIG. 11 using the above-mentioned manufacturing method. And as shown in FIG. 24, photoresist 230 which covers an nMOS region is formed.

Figure 25:
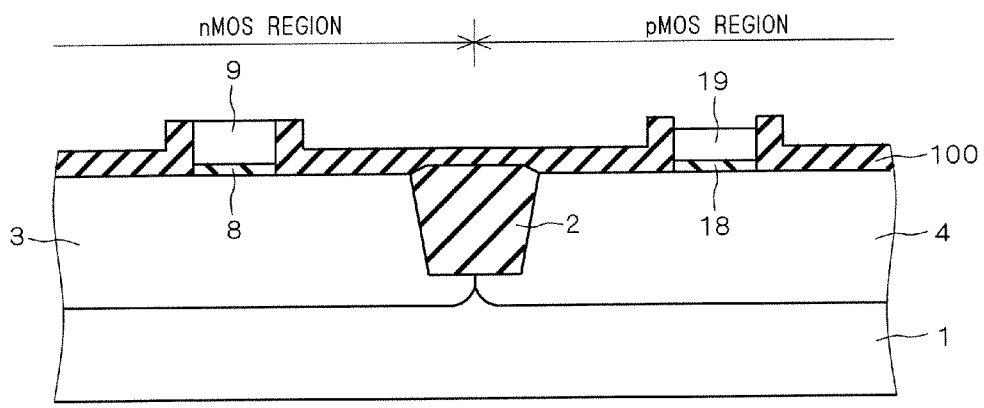

Next, photoresist 230 is used for a mask, dry etching is performed to exposed gate electrode 19, and the gate electrode 19 concerned is removed partially. Then, photoresist 230 is removed. Hereby, as shown in FIG. 25, the thickness of gate electrode 19 including p type impurities $110p$ becomes thinner than gate electrode 9 including $110n$ of n type impurities.

Figure 26:
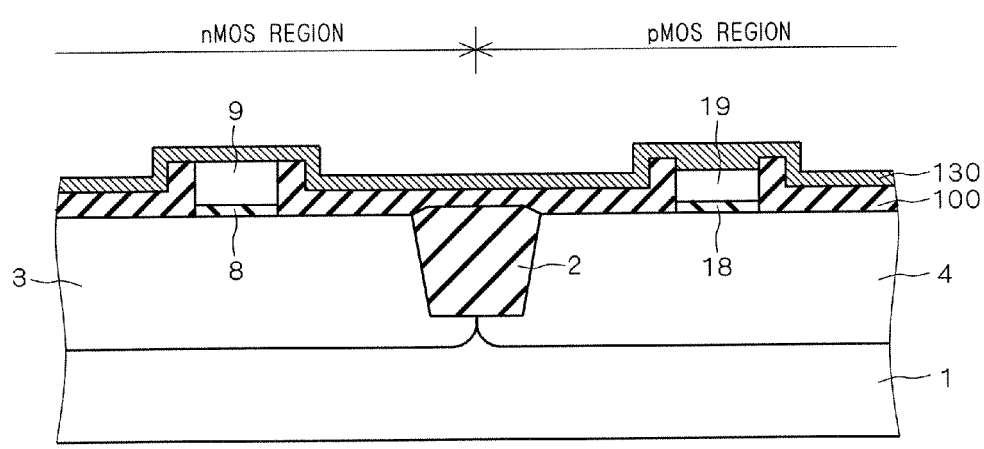
Figure 27:
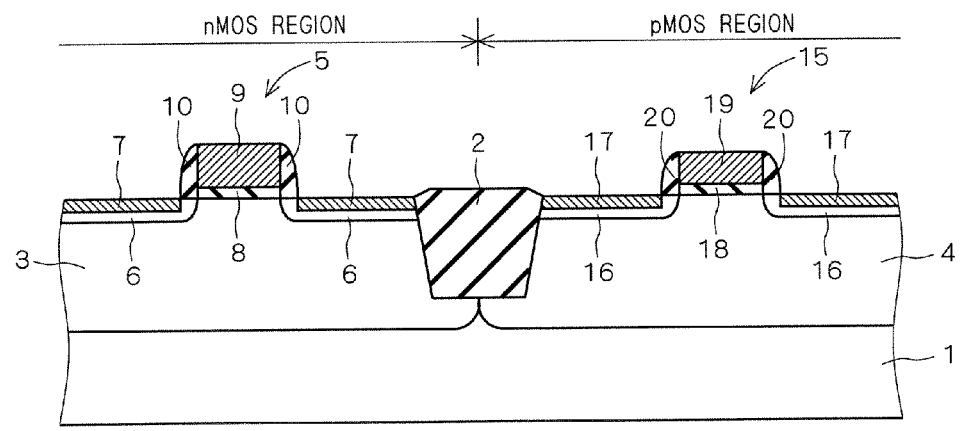

Next, as shown in FIG. 26, metallic material 130 is formed at the whole surface. And a heat treatment is performed to the acquired structure and all the regions of gate electrodes 9 and 19 are silicided. Then, when source/drain regions 6 and 16 are silicided and sidewalls 10 and 20 are formed similarly, the semiconductor device shown in FIG. 27 will be obtained.

Generally, in the gate electrode into which p type impurities, such as a boron, were introduced, the speed of advance of a silicide reaction becomes slow as compared with the gate electrode into which n type impurities were introduced. Therefore, when gate electrode 9 including n type impurities 110n is formed by the same thickness as gate electrode 19 including p type impurities 110p, the side of the silicidation to gate electrode 9 is completed earlier than the silicidation to gate electrode 19, and the heat treatment more than needed is applied to gate electrode 9. As a result, the electric resistance of gate electrode 9 may rise.

In the above-mentioned modification, since gate electrode 19 with which a silicide reaction becomes slow is formed thinly, the silicidation to gate electrode 19 and the silicidation to gate electrode 9 can be ended almost simultaneously. Therefore, n type gate electrode 9 is not exposed to a heat treatment more than needed. As a result, the rise of the electric resistance of n type gate electrode 9 can be suppressed, and the performance of nMOS transistor 5 can be improved.

Embodiment 2

Figure 28:
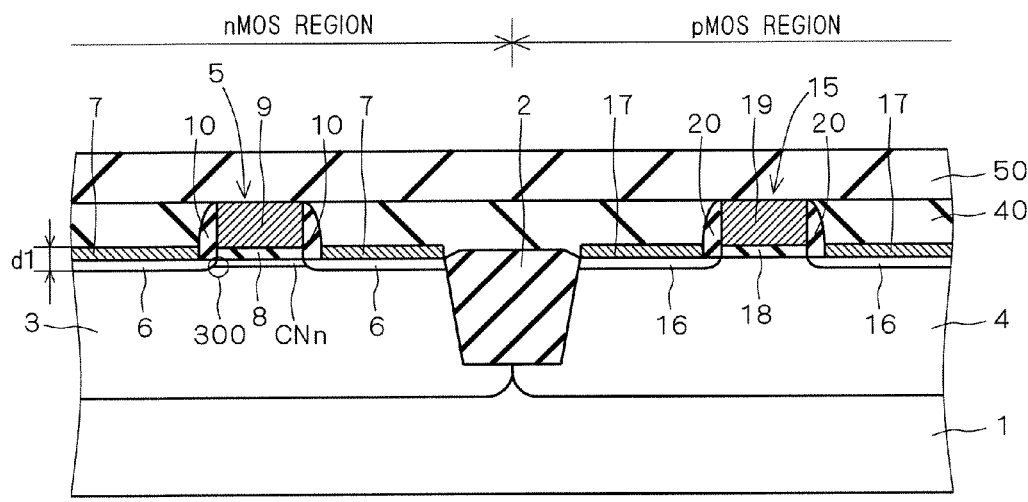
FIG. 28 is a cross-sectional view showing the structure of the semiconductor device concerning Embodiment 2 of the present invention.

FIG. 28 is a cross-sectional view showing the structure of the semiconductor device concerning Embodiment 2 of the present invention. Although silicide layers 7 and 17 were formed in the upper surface of semiconductor substrate 1 in the semiconductor device concerning above-mentioned Embodiment 1, silicide layers 7 and 17 are formed on the upper surface of semiconductor substrate 1 in the semiconductor device concerning Embodiment 2. Therefore, the upper surface of silicide layer 7 is located up rather than the upper surface of the portion on which gate insulating film 8 is formed in semiconductor substrate 1, and the upper surface of silicide layer 17 is located up rather than the upper surface of the portion on which gate insulating film 18 is formed in semiconductor substrate 1. Concretely, the upper surface of silicide layers 7 and 17 is located in the 5 nm or more upper part, respectively rather than the upper surface of the portion on which gate insulating films 8 and 18 are formed in semiconductor substrate 1. Since it is the same as that of the semiconductor device concerning Embodiment 1 about other structures, the explanation is omitted.

Thus, in the semiconductor device concerning Embodiment 2, the upper surface of silicide layer 7 of source/drain region 6 is located in the 5 nm or more upper part rather than the upper surface of the portion on which gate insulating film 8 is formed in semiconductor substrate 1, in other words the portion in contact with gate insulating film 8 in the upper surface of semiconductor substrate 1. Therefore, maintaining thickness d1 of the source/drain region 6 whole including silicide layer 7 to the same value as the thickness d1 concerned of the semiconductor device concerning Embodiment 1 shown in FIG. 1, as shown in FIG. 28, the area of boundary region 300 of source/drain region 6 and channel region CNn of nMOS transistor 5 can be reduced. Therefore, it becomes difficult for the impurity in source/drain region 6 to diffuse to channel region CNn by the heat treatment at the time of siliciding gate electrode 9. Therefore, degradation of the short channel characteristics of nMOS transistor 5 can be prevented, and the performance of nMOS transistor 5 can be improved.

Since the upper surface of silicide layer 7 is located in the 5 nm or more upper part rather than the upper surface of the portion on which gate insulating film 8 is formed in semiconductor substrate 1, silicide layer 7 can be formed thickly as compared with the semiconductor device concerning Embodiment 1. Since it will generally be hard to be influenced by heat treatment when silicide layer 7 is thick, it becomes difficult to generate cohesion of silicide. Therefore, when siliciding gate electrode 9 after siliciding source/drain region 6, the cohesion generated in silicide layer 7 by the heat treatment by the silicidation of gate electrode 9 can be suppressed. As a result, the rise of the electric resistance in source/drain region 6 and the increase in junction leak can be suppressed, and the performance of nMOS transistor 5 can be improved.

The same thing can be said also about pMOS transistor 15. When the upper surface of silicide layer 17 is located in the 5 nm or more upper part rather than the upper surface of the portion on which gate insulating film 18 is formed in semiconductor substrate 1, the performance of pMOS transistor 15 can be improved.

Next, the manufacturing method of the semiconductor device shown in FIG. 28 is explained. FIGS. 29-39 are the cross-sectional views showing the manufacturing method of the semiconductor device concerning Embodiment 2 at process order. First, the manufacture is made to the structure shown in FIG. 4 using the manufacturing method concerning Embodiment 1. And like Embodiment 1, n type impurities 110n are introduced into polysilicon film 90 in an nMOS region, and p type impurities 110p are introduced into polysilicon film 90 in a pMOS region.

Figure 29:
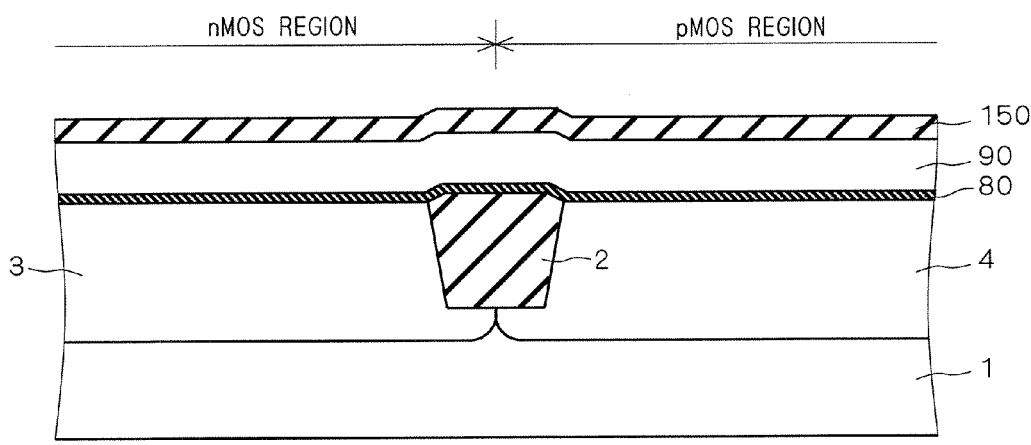
Figure 30:
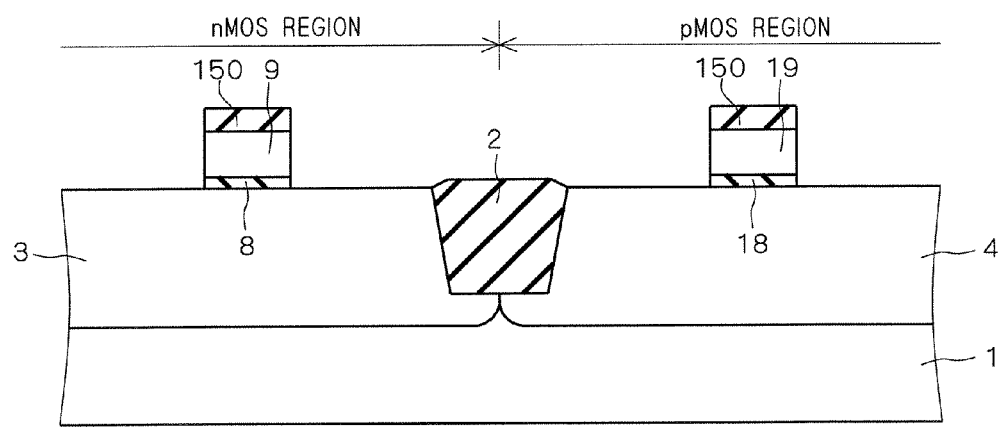

Next, as shown in FIG. 29, silicon nitride film 150 is formed on polysilicon film 90. And silicon nitride film 150, polysilicon film 90, and insulating film 80 are patterned one by one. Hereby, as shown in FIG. 30, gate electrodes 9 and 19 which include polysilicon film 90, and gate insulating films 8 and 18 which include insulating film 80 are completed, and silicon nitride film 150 is formed on each of gate electrodes 9 and 19. Then, the extension regions of nMOS transistor 5 and pMOS transistor 15 are formed in p type well region 3 and n type well region 4, respectively, and pocket implantation is performed.

Next, as shown in FIG. 31, insulating film 100 used as a sidewall is formed at the whole surface, covering silicon nitride film 150, gate insulating films 8 and 18, and gate electrodes 9 and 19. And as shown in FIG. 32, sidewalls 10 and 20 are formed, selectively removing insulating film 100 using an anisotropic dry etching method with which an etching rate is high to the thickness direction of semiconductor substrate 1. Sidewall 10 is formed not only on the side face of gate insulating film 8 and gate electrode 9 but on the side face of silicon nitride film 150 on gate electrode 9 at this time. Similarly, sidewall 20 is formed not only on the side face of gate insulating film 18 and gate electrode 19 but on the side face of silicon nitride film 150 on gate electrode 19.

Next, as shown in FIG. 33, semiconductor layer 30 which includes a silicon layer is formed at 5 nm or more in thickness with epitaxial growth all over the upper surface of exposed semiconductor substrate 1, for example. Hereby, semiconductor layer 30 is formed on p type well region 3 so that the sidewall 10 concerned may be contacted in the side of gate insulating film 8, gate electrode 9, and sidewall 10 of nMOS transistor 5. Simultaneously, semiconductor layer 30 is formed on n type well region 4 so that the sidewall 20 concerned may be contacted in the side of gate insulating film 18, gate electrode 19, and sidewall 20 of pMOS transistor 15.

Figure 34:
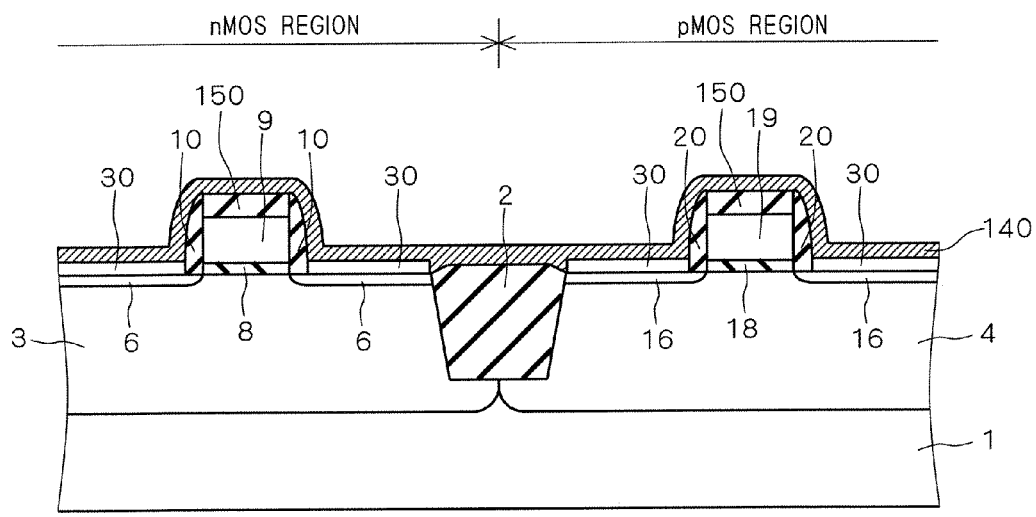

Next, an n type, high-concentration impurity is introduced by ion-implantation in semiconductor layer 30 in an nMOS region, and p type well region 3 under it, and a p type high-concentration impurity is introduced by ion-implantation in semiconductor layer 30 in a pMOS region, and n type well region 4 under it. By this, as shown in FIG. 34, source/drain region 6 of nMOS transistor 5 is formed in semiconductor layer 30 and p type well region 3 in an nMOS region, and source/drain region 16 of pMOS transistor 15 is formed in semiconductor layer 30 and n type well region 4 in a pMOS region. Then, in order to silicide source/drain regions 6 and 16, metallic material 140 is deposited at the whole surface.

Figure 35:
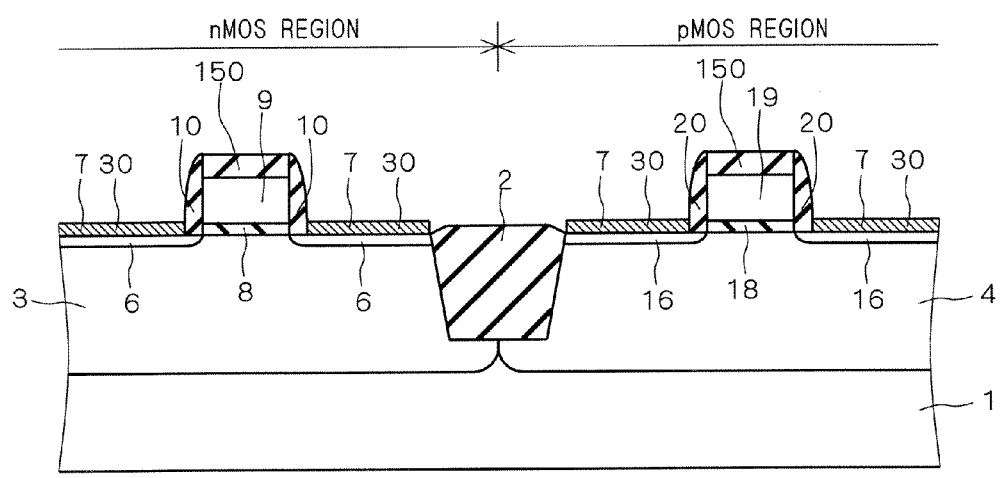

Next, a heat treatment is performed to the acquired structure, all the regions of semiconductor layer 30 are silicided, and unreacted metallic material 140 is removed after that. Hereby, as shown in FIG. 35, silicide layers 7 and 17 are formed in source/drain regions 6 and 16, respectively.

Since silicide layers 7 and 17 are formed by siliciding semiconductor layer 30 with a thickness of 5 nm or more formed on semiconductor substrate 1 from the upper surface, the upper surface of silicide layers 7 and 17 comes to be located in the 5 nm or more upper part, respectively rather than the upper surface of the portion on which gate insulating films 8 and 18 are formed in semiconductor substrate 1.

Since the side faces of gate electrodes 9 and 19 are covered by sidewalls 10 and 20, respectively and those upper surfaces are covered with silicon nitride film 150, gate electrodes 9 and 19 are not silicided in the case of the silicidation of source/drain regions 6 and 16.

Figure 36:
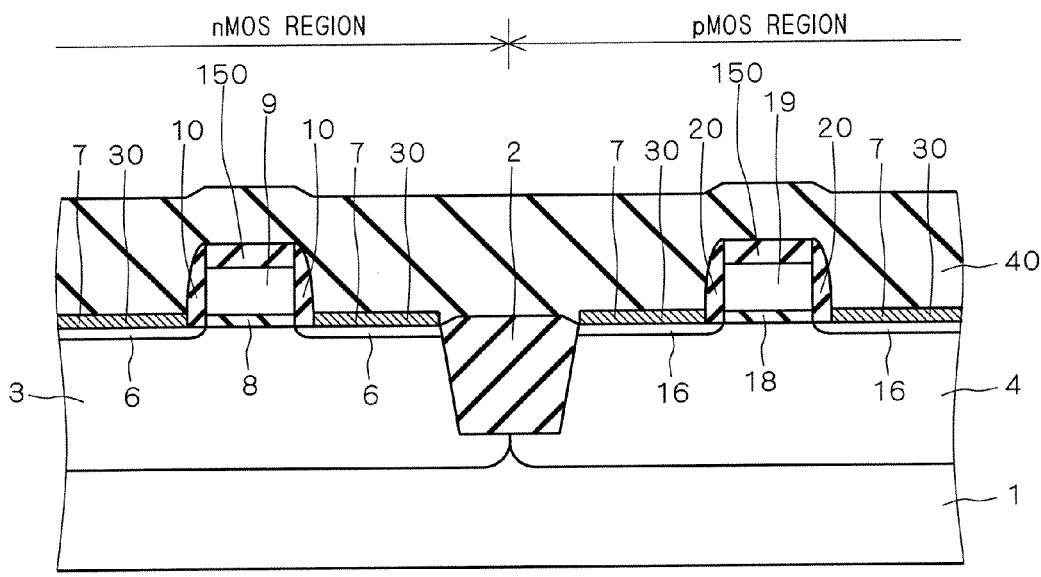
Figure 37:
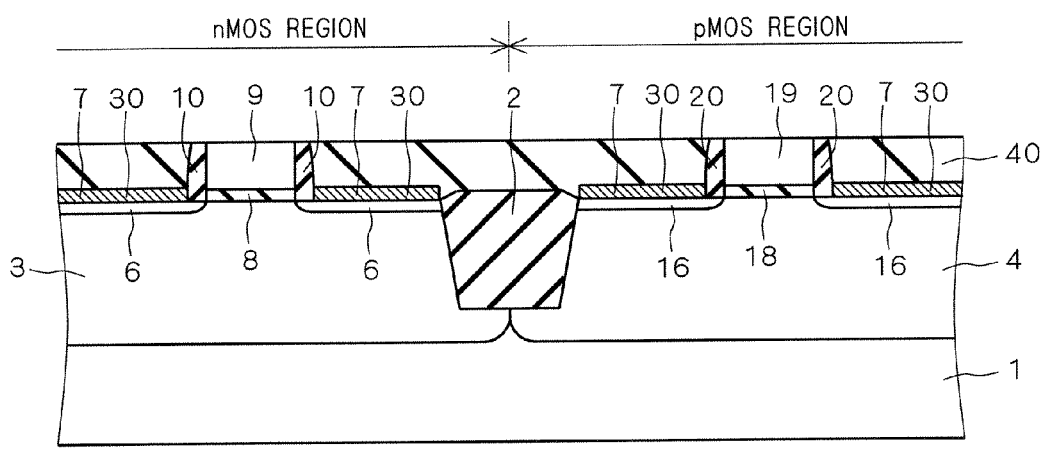

Next, as shown in FIG. 36, interlayer insulation film 40 is formed at the whole surface. And interlayer insulation film 40 is polished from the upper surface using a CMP method which uses silicon nitride film 150 on gate electrode 9 and 19 as a stopper layer. And exposed silicon nitride film 150 is removed by performing dry etching. Hereby, as shown in FIG. 37, the upper surfaces of gate electrodes 9 and 19 are exposed.

Figure 38:
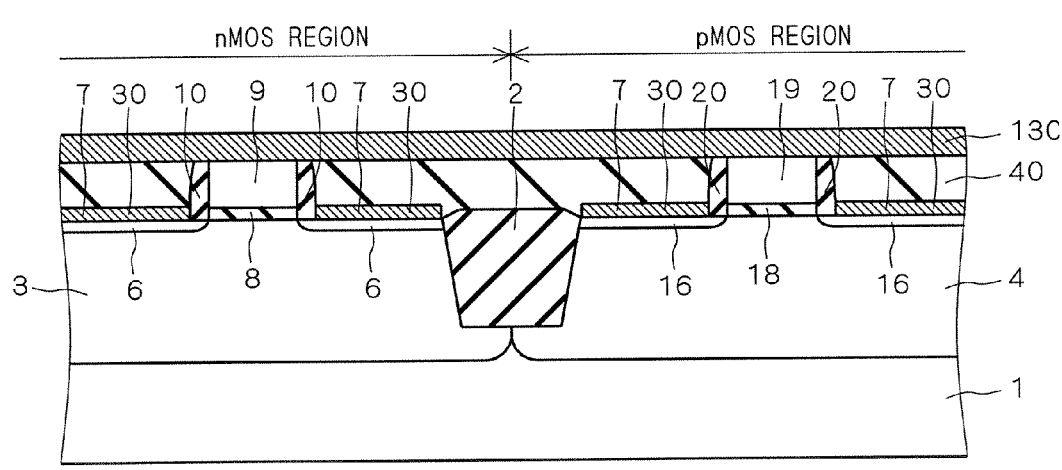
Figure 39:
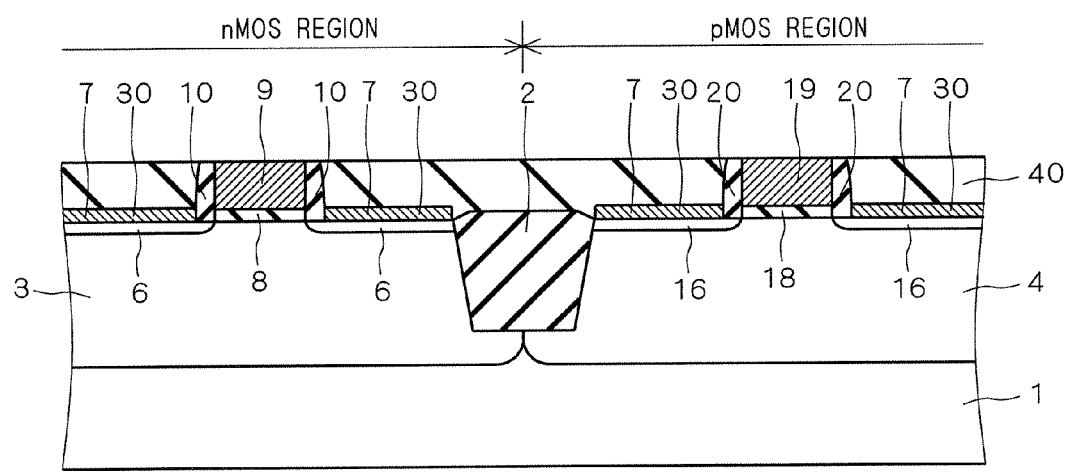

Next, as shown in FIG. 38, in order to silicide gate electrodes 9 and 19, metallic material 130 is formed at the whole surface. And a heat treatment is performed to the acquired structure and all the regions of gate electrodes 9 and 19 are silicided. Then, unreacted metallic material 130 is removed. Hereby, as shown in FIG. 39, gate electrodes 9 and 19 of a FUSI gate electrode are completed. Then, the structure shown in FIG. 28 is completed by forming interlayer insulation film 50 at the whole surface.

After formation of interlayer insulation film 50, a contact step is usually performed and the contact plug which is not illustrated is formed in interlayer insulation film 40 and 50.

As mentioned above, in the manufacturing method of the semiconductor device concerning Embodiment 2, semiconductor layer 30 is formed on semiconductor substrate 1, and source/drain region 6 is formed in the semiconductor layer 30. Therefore, it becomes difficult for the impurity in source/drain region 6 to diffuse to the channel region of nMOS transistor 5 by the heat treatment by the silicidation of gate electrode 9. Therefore, degradation of the short channel characteristics of nMOS transistor 5 can be prevented, and the performance of nMOS transistor 5 improves.

Since source/drain region 6 formed in semiconductor layer 30 is silicided, silicide layer 7 in source/drain region 6 can be thickly formed by adjusting the thickness of semiconductor layer 30. Since it will be hard to be influenced by heat treatment when silicide layer 7 is thick, it becomes difficult to generate cohesion of silicide. Therefore, the cohesion generated in silicide layer 7 of source/drain region 6 by the heat treatment by the silicidation of gate electrode 9 can be suppressed. As a result, the rise of the electric resistance in source/drain region 6 and the increase in junction leak can be suppressed, and the performance of nMOS transistor 5 can be improved. The same thing can be said also about pMOS transistor 15, and the performance of pMOS transistor 15 can be improved.

In Embodiment 2, semiconductor layer 30 is formed by epitaxial growth. Generally, in the semiconductor layer formed by epitaxial growth, since it is harder to diffuse an impurity than the semiconductor layer of polycrystals, such as a polysilicon layer, diffusion of the impurity in source/drain region 6 and 16 by the heat treatment by the silicidation of gate electrodes 9 and 19 can be suppressed. Therefore, degradation of the short channel characteristics of nMOS transistor 5 or pMOS transistor 15 can be prevented.

Figure 40:
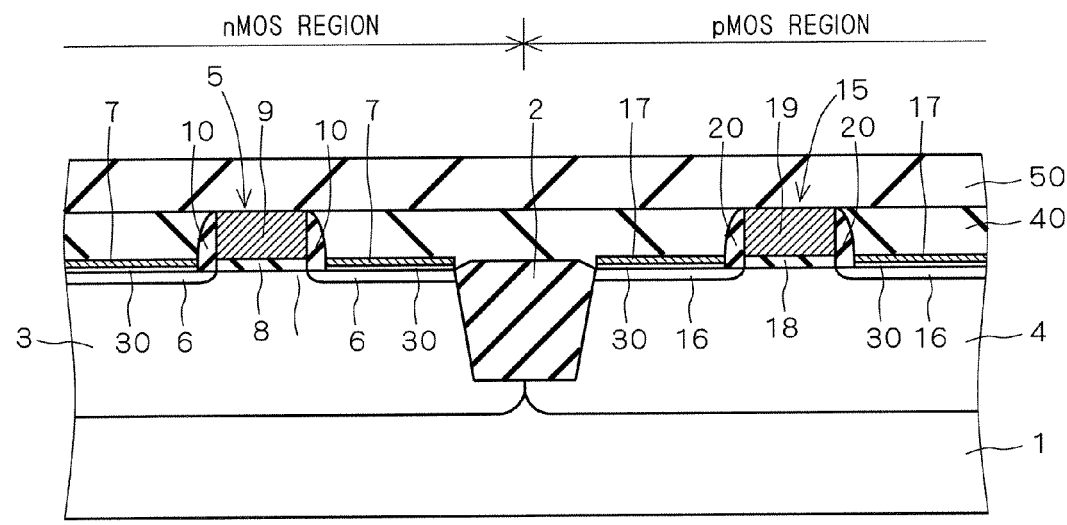
FIG. 40 is a cross-sectional view showing the first modification of the structure of the semiconductor device concerning Embodiment 2 of the present invention.

In Embodiment 2, although all the regions of semiconductor layer 30 were silicided, silicide layers 7 and 17 may be formed, partially siliciding semiconductor layer 30 from the upper surface. In the semiconductor device formed by doing in this way, as shown in FIG. 40, silicide layers 7 and 17 are formed on semiconductor substrate 1 via semiconductor layer 30.

Figure 41:
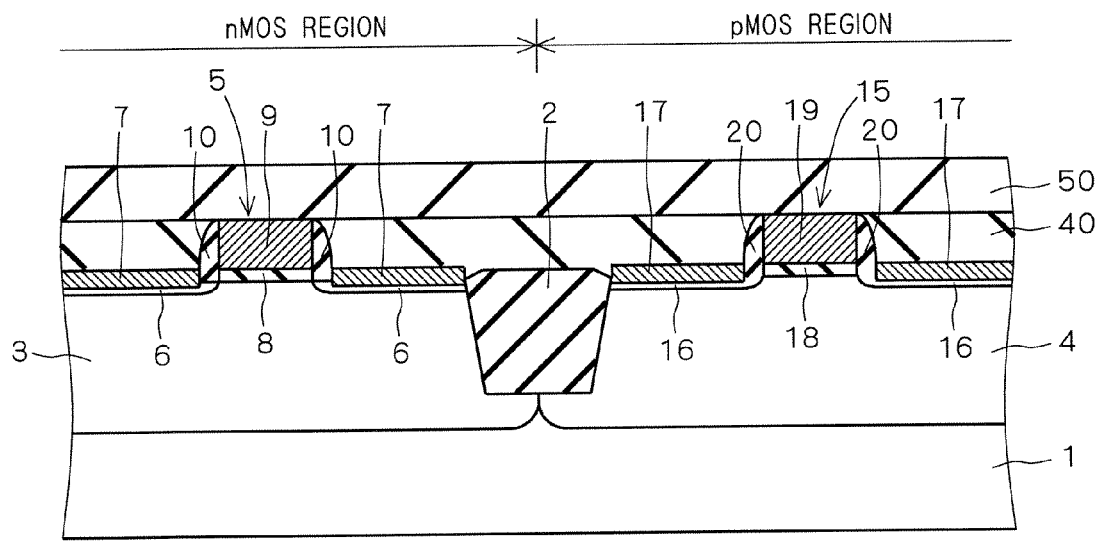
FIG. 41 is a cross-sectional view showing the second modification of the structure of the semiconductor device concerning Embodiment 2 of the present invention.

When siliciding source/drain regions 6 and 16, not only semiconductor layer 30 but the inside of the upper surface of semiconductor substrate 1 may be silicided. Hereby, the semiconductor device shown in FIG. 41 is obtained.

Just before forming interlayer insulation film 40, a silicon nitride film (not shown) may be formed at the whole surface, and interlayer insulation film 40 may be formed on the silicon nitride film concerned. In this case, when forming a contact hole in interlayer insulation films 40 and 50 at a later step, dry etching can be stopped with the silicon nitride film concerned. Hereby, the amount of over-etchings at the time of forming a contact hole can be reduced.

Mutually different materials may be used for metallic material 130 used when siliciding gate electrodes 9 and 19, and metallic material 140 used when siliciding source/drain regions 6 and 16. Hereby, selection of a suitable metallic material is attained in each of gate electrodes 9 and 19 and source/drain regions 6 and 16.

In Embodiment 2, since unlike Embodiment 1 gate electrodes 9 and 19 are silicided after siliciding source/drain regions 6 and 16, nickel and palladium are used as metallic material 130, and cobalt is used as metallic material 140, for example. When it does so, unlike Embodiment 1, gate electrodes 9 and 19 will be formed by nickel silicide or palladium silicide, and silicide layers 7 and 17 of source/drain regions 6 and 16 will come to be formed by cobalt silicide. As mentioned above, generally, since cobalt silicide excels nickel silicide and palladium silicide in thermostability, the electrical property seldom changes with heat treatments. Therefore, it can be suppressed that the electrical property of source/drain regions 6 and 16 changes in the case of the heat treatment by the silicidation of gate electrodes 9 and 19. As a result, the performance of nMOS transistor 5 and pMOS transistor 15 can be improved further.

Since nickel and palladium generate a silicide reaction at low temperature rather than cobalt, when nickel and palladium are used as metallic material 130 and cobalt is used as metallic material 140, the silicidation of gate electrodes 9 and 19 can be performed at low temperature rather than the silicidation of source/drain regions 6 and 16. Therefore, it can be suppressed that the silicide in silicide layer 7 and 17 of source/drain regions 6 and 16 coheres with the heat treatments by the silicidation of gate electrodes 9 and 19, and it can be prevented that the electrical property of the source/drain regions 6 and 16 concerned changes.

It is more desirable to use palladium rather than nickel as metallic material 130, since the case of using palladium as metallic material 130 generates a silicide reaction at further low temperature rather than the case where nickel is used.

In Embodiment 2, although gate electrode 9 of nMOS transistor 5 including n type impurities 110n is formed by the same thickness as gate electrode 19 of pMOS transistor 15 including p type impurities 110p, gate electrode 19 may be formed more thinly than gate electrode 9. The manufacturing method in this case is explained below.

Figure 42:
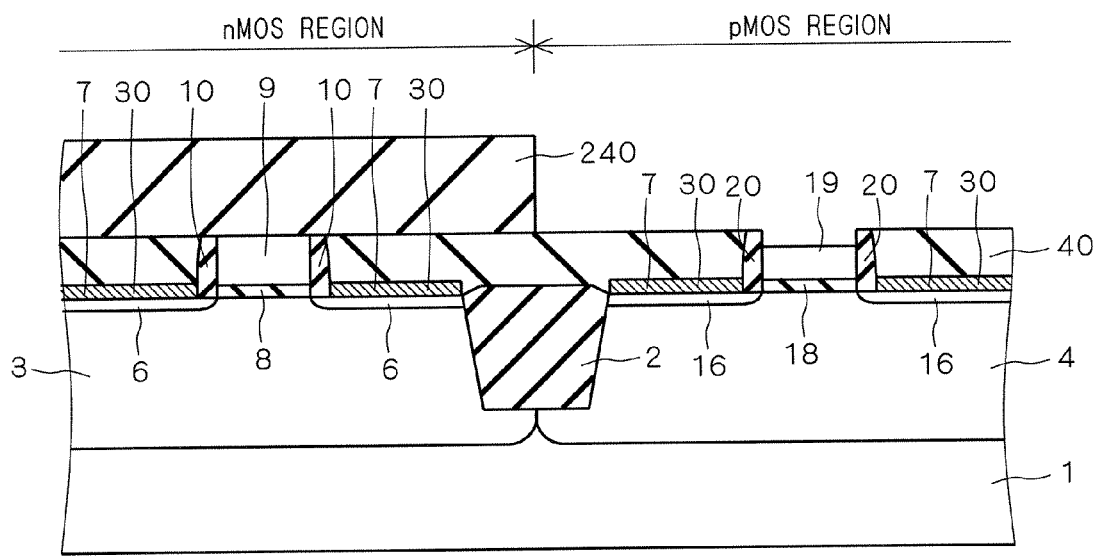
FIGS. 42 to 44 are cross-sectional views showing the first modification of the manufacturing method of the semiconductor device concerning Embodiment 2 of the present invention at process order.
Figure 43:
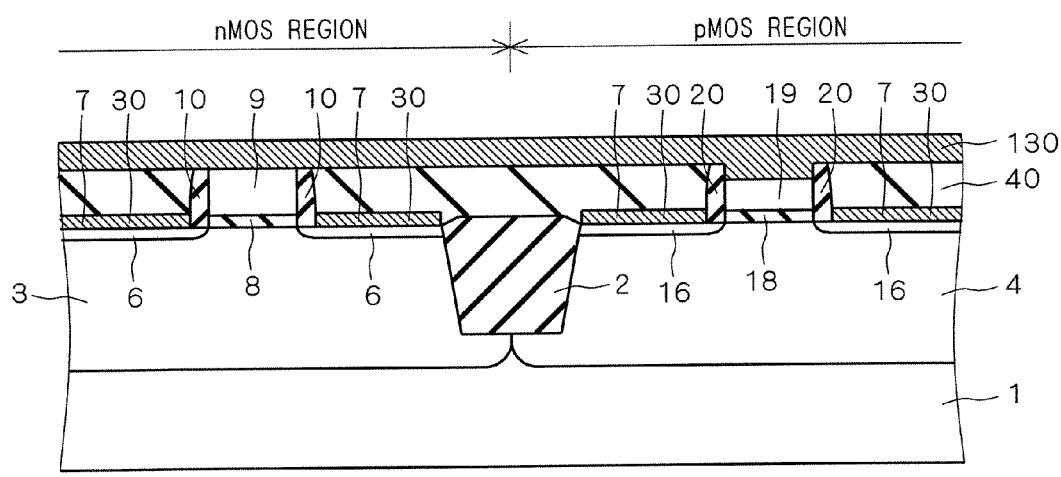
Figure 44:
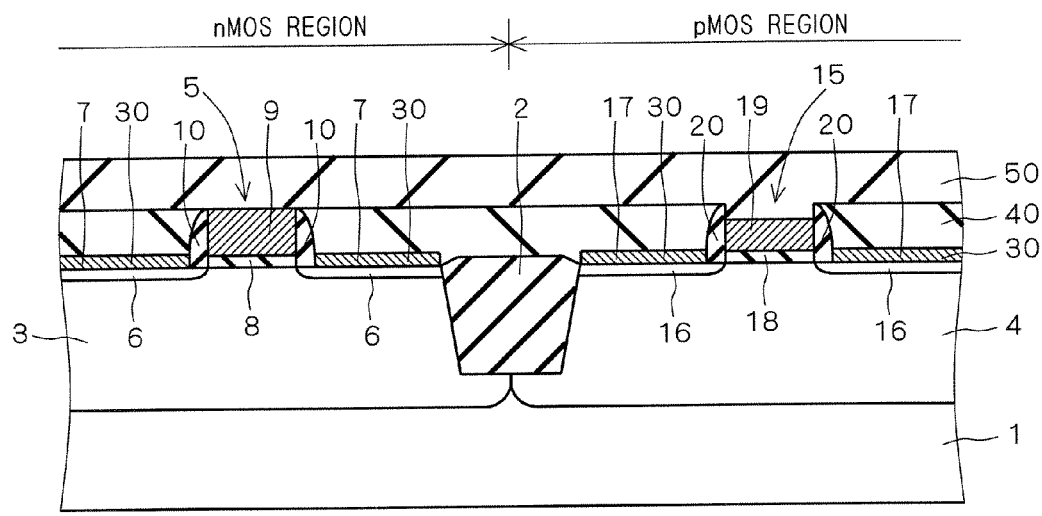

FIGS. 42-44 are the cross-sectional views showing the modification of the manufacturing method of the semiconductor device concerning Embodiment 2 at process order. First, the manufacture is made to the structure shown in FIG. 37 using the above-mentioned manufacturing method. And as shown in FIG. 42, photoresist 240 which covers an nMOS region is formed, the photoresist 240 concerned is used for a mask, dry etching is performed to exposed gate electrode 19, and the gate electrode 19 concerned is removed partially. Hereby, the thickness of gate electrode 19 becomes thinner than gate electrode 9. Then, photoresist 240 is removed.

Next, as shown in FIG. 43, metallic material 130 is formed at the whole surface. And a heat treatment is performed to the acquired structure and all the regions of gate electrodes 9 and 19 are silicided. Then, when unreacted metallic material 130 is removed and interlayer insulation film 50 is formed, the semiconductor device shown in FIG. 44 will be obtained.

As mentioned above, generally with the gate electrode into which p type impurities, such as a boron, were introduced, the speed of advance of a silicide reaction becomes slow as compared with the gate electrode into which the n type impurities were introduced. Therefore, like the above-mentioned modification, the silicidation to p type gate electrode 19 and the silicidation to n type gate electrode 9 can be ended almost simultaneously by forming thinly gate electrode 19 with which a silicide reaction becomes slow. Therefore, n type gate electrode 9 is not exposed to a heat treatment more than needed, and the rise of electric resistance of n type gate electrode 9 can be suppressed.

The upper surface of semiconductor substrate 1 may be dug down partially, and semiconductor layer 30 may be formed at the dug-down portion. The manufacturing method in this case is explained below.

Figure 45:
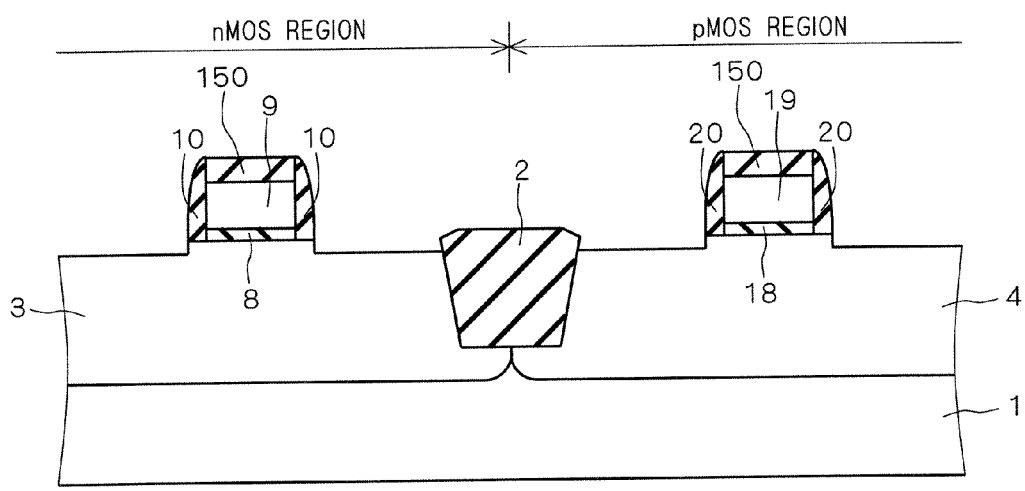
FIGS. 45 to 49 are cross-sectional views showing the second modification of the manufacturing method of the semiconductor device concerning Embodiment 2 of the present invention at process order.

FIGS. 45-49 are the cross-sectional views showing another modification of the manufacturing method of the semiconductor device concerning Embodiment 2 at process order. First, the manufacture is made to the structure shown in FIG. 32 using the above-mentioned manufacturing method. And the exposing portion of semiconductor substrate 1 is removed partially, using a dry etching method etc. Hereby, as shown in FIG. 45, in the side of gate insulating film 8 and gate electrode 9, and the side of gate insulating film 18 and gate electrode 19, the upper surface of semiconductor substrate 1 is dug down partially.

Figure 46:
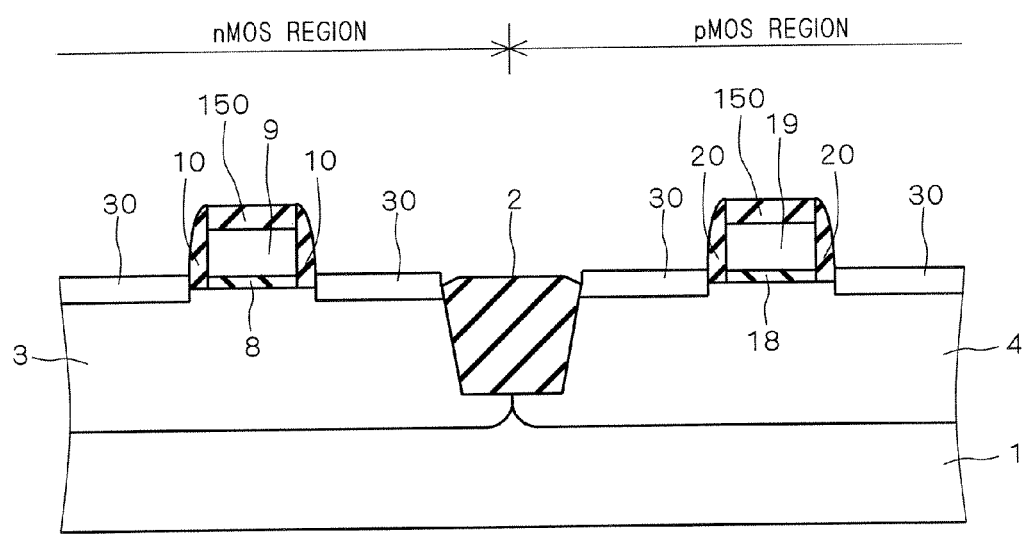

Next, as shown in FIG. 46, semiconductor layer 30 is formed all over the exposed upper surface of semiconductor substrate 1. Hereby, semiconductor layer 30 is formed at the dug-down portion of semiconductor substrate 1. At this time, the thickness of semiconductor layer 30 is set as a value at which the upper surface of the semiconductor layer 30 concerned is located in the 5 nm or more upper part rather than the upper surface of the portion on which gate insulating films 8 and 18 are formed in semiconductor substrate 1.

Figure 47:
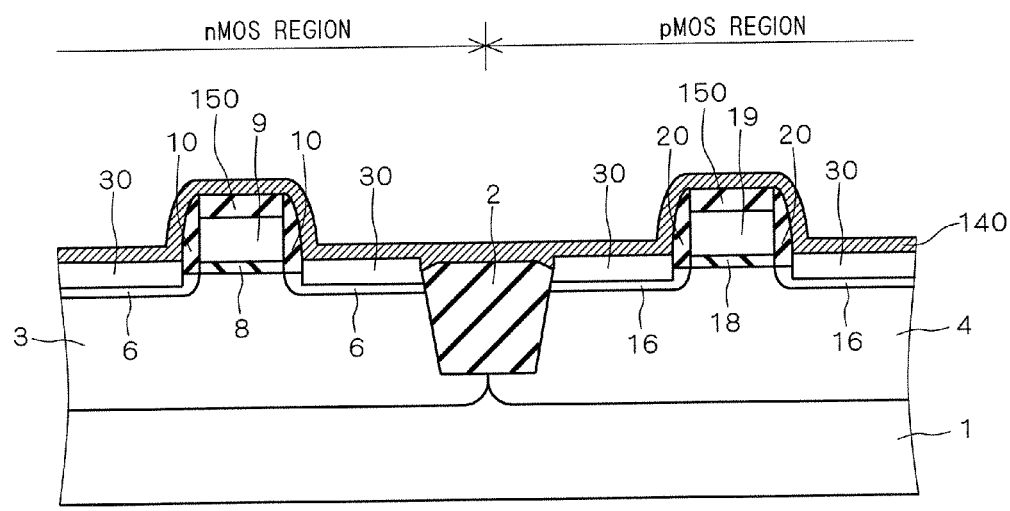

Next, as shown in FIG. 47, like the above-mentioned manufacturing method, source/drain region 6 is formed in semiconductor layer 30, and p type well region 3 under it in an nMOS region, and source/drain region 16 is formed in semiconductor layer 30, and n type well region 4 under it in a pMOS region. And in order to silicide source/drain regions 6 and 16, metallic material 140 is deposited at the whole surface.

Figure 48:
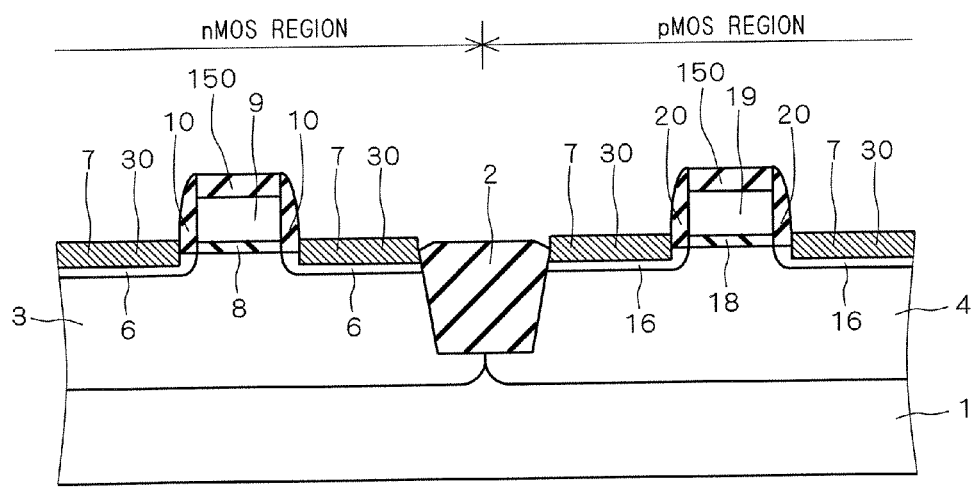

Next, a heat treatment is performed to the acquired structure, all the regions of semiconductor layer 30 are silicided, and unreacted metallic material 140 is removed after that. Hereby, as shown in FIG. 48, silicide layers 7 and 17 are formed in source/drain regions 6 and 16, respectively. The upper surface of silicide layers 7 and 17 at this time comes to be located in the 5 nm or more upper part like the semiconductor device shown in FIG. 28 rather than the upper surface of the portion on which gate insulating films 8 and 18 are formed in semiconductor substrate 1. Since semiconductor layer 30 is formed at the portion at which semiconductor substrate 1 was dug down, the under surface of silicide layers 7 and 17 comes to be located below rather than the upper surface of the portion on which gate insulating films 8 and 18 are formed in semiconductor substrate 1.

Figure 49:
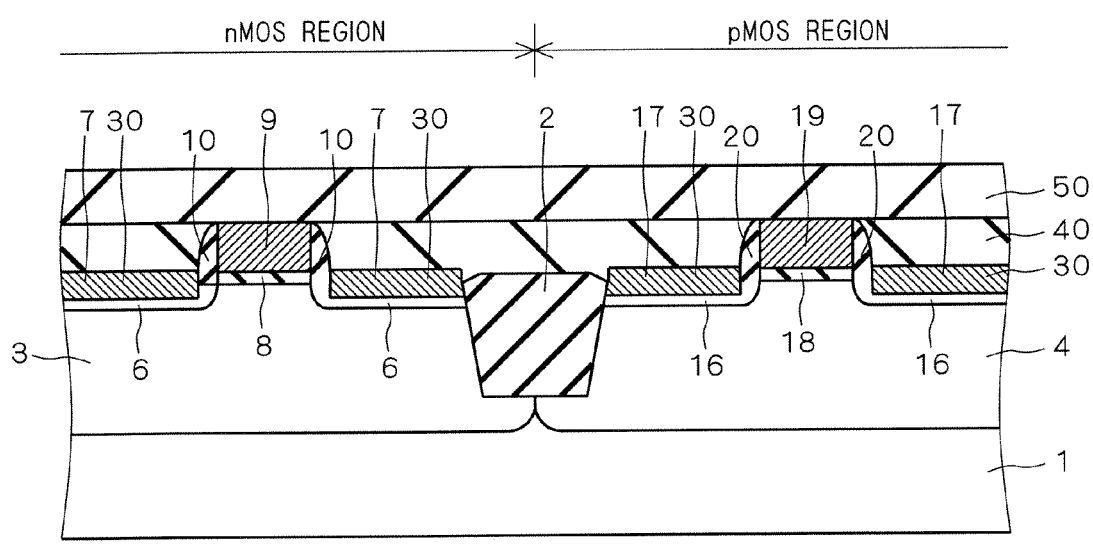

Then, like the above-mentioned manufacturing method, the structure shown in FIG. 49 is acquired by forming interlayer insulation film 40, siliciding gate electrodes 9 and 19, and forming interlayer insulation film 50.

Thus, the damages with which the upper surface of semiconductor substrate 1 received by then, such as the etching damage at the time of forming sidewalls 10 and 20, are removable by digging down the upper surface of semiconductor substrate 1. As a result, the crystal defect in semiconductor layer 30 can be reduced, and junction leak in source/drain regions 6 and 16 formed in the semiconductor layer 30 concerned can be reduced.

When digging down the upper surface of semiconductor substrate 1 partially and forming semiconductor layer 30 at the dug-down portion like this modification, semiconductor layer 30 having included germanium may be formed. Hereby, in source/drain region 6, germanium comes to exist over the lower part rather than the upper surface of the portion on which gate insulating film 8 is formed in semiconductor substrate 1 from the upper surface, and in source/drain region 16, germanium comes to exist over the lower part rather than the upper surface of the portion on which gate insulating film 18 is formed in semiconductor substrate 1 from the upper surface.

Thus, by including germanium in semiconductor layer 30, a tensile strain (lattice strain) occurs in the boundary of the semiconductor layer 30 concerned and the channel region of nMOS transistor 5 in semiconductor substrate 1, as a result, the electron mobility in nMOS transistor 5 improves, and nMOS transistor 5 excellent in driving ability can be realized. Similarly, since a tensile strain (lattice strain) occurs in the boundary of semiconductor layer 30 including germanium and the channel region of pMOS transistor 15 in semiconductor substrate 1, the electron mobility in pMOS transistor 15 improves, and pMOS transistor 15 excellent in driving ability can be realized.

Since growing temperature can be set as low temperature when forming semiconductor layer 30 including germanium by epitaxial growth, diffusion of impurities introduced into semiconductor substrate 1 by then, such as impurities in the extension regions in nMOS transistor 5 or pMOS transistor 15, can be suppressed. As a result, the semiconductor device which has desired performance becomes easy to be obtained.

What is claimed is:

1. A manufacturing method of a semiconductor device, comprising the steps of:
   (a) forming a gate insulating film and a gate electrode of a first MOS transistor over a semiconductor substrate, laminating in this order;

(b) siliciding all regions of the gate electrode;
(c) forming a source/drain region of the first MOS transistor in an upper surface of the semiconductor substrate after step (b); and
(d) siliciding the source/drain region after the steps (b) and (c).

2. A manufacturing method of a semiconductor device, comprising the steps of:
(a) forming a gate insulating film and a gate electrode of a first MOS transistor over a semiconductor substrate, laminating in this order;
(b) siliciding the gate electrode partially;
(c) forming a source/drain region of the first MOS transistor in an upper surface of the semiconductor substrate after step (b); and
(d) siliciding simultaneously the source/drain region and all regions of a portion which is not silicided in the gate electrode after the steps (b) and (c).

3. A manufacturing method of a semiconductor device according to claim 1, wherein
mutually different materials are used for a metallic material used by silicidation in the step (b), and a metallic material used by silicidation in the step (d).

4. A manufacturing method of a semiconductor device according to claim 3, wherein
what excels silicide of a metallic material used by silicidation in the step (d) in thermostability of silicide is used as a metallic material used by silicidation in the step (b).

5. A manufacturing method of a semiconductor device according to claim 3, wherein
what generates a silicide reaction at low temperature rather than a metallic material used by silicidation in the step (b) is used as a metallic material used by silicidation in the step (d).

6. A manufacturing method of a semiconductor device according to claim 4, wherein
cobalt is used as a metallic material used by silicidation in the step (b); and
nickel or palladium is used as a metallic material used by silicidation in the step (d).

7. A manufacturing method of a semiconductor device according to claim 1, further comprising the steps of:
(e) before the step (b), forming at a whole surface an insulating film which serves as a sidewall at the semiconductor substrate upper part, covering the gate insulating film and the gate electrode;
(f) before the step (b), forming photoresist over the insulating film at a whole surface;
(g) before the step (b), exposing an upper surface of a portion located over the gate electrode in the insulating film, removing the photoresist partially;

(h) before the step (b) and after the step (g), exposing an upper surface of the gate electrode, removing selectively a portion which is exposed in the insulating film, using the photoresist as a protective film to a portion which is not exposed in the insulating film;
(i) after the step (h), removing a remaining portion of the photoresist; and
(j) after the steps (b) and (i), forming a sidewall over a side face of the gate insulating film and the gate electrode, removing the insulating film partially.

8. A manufacturing method of a semiconductor device according to claim 1, wherein
in the step (a), while forming the gate insulating film and the gate electrode of the first MOS transistor, a gate insulating film and a gate electrode of a second MOS transistor are formed over the semiconductor substrate, laminating in this order;
in the step (b), all regions of each of the gate electrode of the first and the second MOS transistors are silicided;
in the step (c), each source/drain region of the first and the second MOS transistors is formed in an upper surface of the semiconductor substrate;
in the step (d), the each source/drain region of the first and the second MOS transistors is silicided; and
in the step (a), the gate electrode of the first MOS transistor in which n type impurities are introduced, and the gate electrode thinner than the gate electrode concerned of the second MOS transistor in which p type impurities are introduced are formed.

9. A manufacturing method of a semiconductor device according to claim 2, wherein
in the step (a), while forming the gate insulating film and the gate electrode of the first MOS transistor, a gate insulating film and a gate electrode of a second MOS transistor are formed over the semiconductor substrate, laminating in this order;
in the step (b), the each gate electrode of the first and the second MOS transistors is silicided partially;
in the step (c), each source/drain region of the first and the second MOS transistors is formed in an upper surface of the semiconductor substrate;
in the step (d), the each source/drain region of the first and the second MOS transistors and all regions of a portion in the each gate electrode of the first and the second MOS transistors which is not silicided are silicided simultaneously; and
in the step (a), the gate electrode of the first MOS transistor in which n type impurities are introduced, and the gate electrode thinner than the gate electrode concerned of the second MOS transistor in which p type impurities are introduced are formed.

* * * * *